(12) United States Patent
Kayes et al.

(10) Patent No.: US 11,271,133 B2
(45) Date of Patent: Mar. 8, 2022

(54) MULTI-JUNCTION OPTOELECTRONIC DEVICE WITH GROUP IV SEMICONDUCTOR AS A BOTTOM JUNCTION

(71) Applicant: UTICA LEASECO, LLC, Rochester Hills, MI (US)

(72) Inventors: Brendan M. Kayes, Los Gatos, CA (US); Gang He, Cupertino, CA (US)

(73) Assignee: UTICA LEASECO, LLC, Rochester Hills, MI (US)

(*) Notice: Subject to any disclaimer, the term of this patent is extended or adjusted under 35 U.S.C. 154(b) by 0 days.

(21) Appl. No.: 15/957,446

(22) Filed: Apr. 19, 2018

(65) Prior Publication Data

US 2018/0248069 A1 Aug. 30, 2018

Related U.S. Application Data

(60) Division of application No. 15/417,105, filed on Jan. 26, 2017, which is a continuation-in-part of (Continued)

(51) Int. Cl.
*H01L 31/0687* (2012.01)
*H01L 31/18* (2006.01)
(Continued)

(52) U.S. Cl.
CPC .......... *H01L 31/184* (2013.01); *H01L 31/028* (2013.01); *H01L 31/06875* (2013.01);
(Continued)

(58) Field of Classification Search
None
See application file for complete search history.

(56) References Cited

U.S. PATENT DOCUMENTS

| 3,615,853 A | 10/1971 | Paine et al. |
| 3,838,359 A | 9/1974 | Hakki et al. |

(Continued)

FOREIGN PATENT DOCUMENTS

| CN | 1574388 | 2/2005 |
| CN | 102007582 | 4/2011 |

(Continued)

OTHER PUBLICATIONS

Non-Final Office Action issued in U.S. Appl. No. 15/417,105.
(Continued)

*Primary Examiner* — Abul Kalam
(74) *Attorney, Agent, or Firm* — Arent Fox LLP

(57) ABSTRACT

A multi-junction optoelectronic device and method of manufacture are disclosed. The method comprises providing a first p-n structure on a substrate, wherein the first p-n structure comprises a first base layer of a first semiconductor with a first bandgap such that a lattice constant of the first semiconductor matches a lattice constant of the substrate, and wherein the first semiconductor comprises a Group III-V semiconductor. The method includes providing a second p-n structure, wherein the second p-n structure comprises a second base layer of a second semiconductor with a second bandgap, wherein a lattice constant of the second semiconductor matches a lattice constant of the first semiconductor, and wherein the second semiconductor comprises a Group IV semiconductor. The method also includes lifting off the substrate the multi-junction optoelectronic device having the first p-n structure and the second p-n structure, wherein the multi-junction optoelectronic device is a flexible device.

17 Claims, 7 Drawing Sheets

Related U.S. Application Data application No. 13/705,064, filed on Dec. 4, 2012, now Pat. No. 9,768,329, which is a continuation-in-part of application No. 12/939,077, filed on Nov. 3, 2010, now abandoned, and a continuation-in-part of application No. 12/605,108, filed on Oct. 23, 2009, now Pat. No. 8,937,244.

(60) Provisional application No. 62/289,070, filed on Jan. 29, 2016.

(51) Int. Cl.
*H01L 31/028* (2006.01)
*H01L 33/00* (2010.01)
*H01L 33/04* (2010.01)
*H01L 33/30* (2010.01)

(52) U.S. Cl.
CPC .......... *H01L 31/1892* (2013.01); *H01L 33/00* (2013.01); *H01L 33/04* (2013.01); *H01L 33/30* (2013.01); *Y02E 10/544* (2013.01); *Y02E 10/547* (2013.01)

(56) References Cited

U.S. PATENT DOCUMENTS

| | | |
|---|---|---|
| 3,990,101 A | 11/1976 | Ettenberg et al. |
| 4,015,280 A | 3/1977 | Matsushita et al. |
| 4,017,332 A | 4/1977 | James |
| 4,094,704 A | 6/1978 | Milnes et al. |
| 4,107,723 A | 8/1978 | Kamath |
| 4,191,593 A | 3/1980 | Cacheux |
| 4,197,141 A | 4/1980 | Bozler et al. |
| 4,295,002 A | 10/1981 | Chappell et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj et al. |
| 4,444,992 A | 4/1984 | Cox, III |
| 4,479,027 A | 10/1984 | Todorof |
| 4,497,974 A | 2/1985 | Deckman et al. |
| 4,543,441 A | 9/1985 | Kumada et al. |
| 4,571,448 A | 2/1986 | Barnett |
| 4,582,952 A | 4/1986 | McNeely et al. |
| 4,633,030 A | 12/1986 | Cook |
| 4,667,059 A | 5/1987 | Olson |
| 4,773,945 A | 9/1988 | Woolf et al. |
| 4,775,639 A | 10/1988 | Yoshida |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,101,260 A | 3/1992 | Nath et al. |
| 5,103,268 A | 4/1992 | Yin et al. |
| 5,116,427 A | 5/1992 | Fan et al. |
| 5,136,351 A | 8/1992 | Inoue et al. |
| 5,217,539 A | 6/1993 | Fraas et al. |
| 5,223,043 A | 6/1993 | Olson et al. |
| 5,230,746 A | 7/1993 | Wiedeman et al. |
| 5,231,931 A | 8/1993 | Sauvageot et al. |
| 5,316,593 A | 5/1994 | Olson et al. |
| 5,330,585 A | 7/1994 | Chang et al. |
| 5,342,453 A | 8/1994 | Olson |
| 5,356,488 A | 10/1994 | Hezel |
| 5,376,185 A | 12/1994 | Wanlass |
| 5,385,960 A | 1/1995 | Emmons et al. |
| 5,465,009 A | 11/1995 | Drabik et al. |
| 5,468,652 A | 11/1995 | Gee |
| 6,107,563 A | 8/2000 | Nakanishi et al. |
| 6,166,218 A | 12/2000 | Ravichandran |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,372,981 B1 | 4/2002 | Ueda et al. |
| 6,452,091 B1 | 9/2002 | Nakagawa et al. |
| 6,534,336 B1 | 3/2003 | Iwane et al. |
| 6,617,508 B2 | 9/2003 | Kilmer et al. |
| 7,038,250 B2 | 5/2006 | Sugiyama et al. |
| 7,875,945 B2 | 1/2011 | Krasnov et al. |
| 8,183,081 B2 | 5/2012 | Weidman et al. |
| 8,258,596 B2 | 9/2012 | Nasuno et al. |
| 8,664,515 B2 | 3/2014 | Hong et al. |
| 8,697,553 B2 | 4/2014 | Adibi et al. |
| 8,823,127 B2* | 9/2014 | Bedell ............... H01L 31/0725 257/461 |
| 8,895,845 B2 | 11/2014 | Kizilyalli et al. |
| 8,895,846 B2 | 11/2014 | Kizilyalli et al. |
| 8,937,244 B2 | 1/2015 | Kizilyalli et al. |
| 8,993,873 B2 | 3/2015 | Youtsey et al. |
| 9,099,595 B2 | 8/2015 | King et al. |
| 9,136,418 B2 | 9/2015 | Nie et al. |
| 9,136,422 B1 | 9/2015 | Higashi et al. |
| 9,178,099 B2 | 11/2015 | Nie et al. |
| 9,502,594 B2 | 11/2016 | Ding et al. |
| 9,537,025 B1 | 1/2017 | Higashi et al. |
| 9,691,921 B2 | 6/2017 | Atwater et al. |
| 9,768,329 B1 | 9/2017 | Kayes et al. |
| 2001/0027805 A1 | 10/2001 | Ho et al. |
| 2002/0000244 A1 | 1/2002 | Zaidi |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0070707 A1 | 4/2003 | King et al. |
| 2003/0140962 A1 | 7/2003 | Sharps et al. |
| 2003/0222278 A1 | 12/2003 | Liu et al. |
| 2004/0112426 A1 | 6/2004 | Hagino |
| 2004/0166681 A1* | 8/2004 | Iles ................. H01L 31/0687 438/689 |
| 2004/0200523 A1 | 10/2004 | King et al. |
| 2005/0001233 A1 | 1/2005 | Sugiyama et al. |
| 2005/0022863 A1 | 2/2005 | Agostinelli et al. |
| 2006/0081963 A1 | 4/2006 | Rehder et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0185582 A1* | 8/2006 | Atwater ................. C30B 33/06 117/89 |
| 2006/0207651 A1 | 9/2006 | Posthuma et al. |
| 2006/0255340 A1 | 11/2006 | Manivannan et al. |
| 2007/0054474 A1* | 3/2007 | Tracy ............... H01L 21/02381 438/479 |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0151596 A1 | 7/2007 | Nasuno et al. |
| 2007/0166862 A1 | 7/2007 | Kim et al. |
| 2007/0199591 A1 | 8/2007 | Harder et al. |
| 2007/0235074 A1 | 10/2007 | Henley et al. |
| 2007/0277874 A1 | 12/2007 | Dawson-Elli et al. |
| 2008/0128020 A1 | 6/2008 | Zafar et al. |
| 2008/0245409 A1 | 10/2008 | Varghese et al. |
| 2009/0151784 A1 | 6/2009 | Luan et al. |
| 2009/0283802 A1 | 11/2009 | Henderson et al. |
| 2009/0288703 A1 | 11/2009 | Stan et al. |
| 2010/0006143 A1 | 1/2010 | Weiser |
| 2010/0015751 A1 | 1/2010 | Weidman et al. |
| 2010/0047959 A1 | 2/2010 | Cornfeld et al. |
| 2010/0055397 A1 | 3/2010 | Kurihara et al. |
| 2010/0065117 A1 | 3/2010 | Kim et al. |
| 2010/0089443 A1 | 4/2010 | Bloomstein et al. |
| 2010/0096010 A1 | 4/2010 | Weiser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132744 A1 | 6/2010 | Tadaki et al. |
| 2010/0132774 A1 | 6/2010 | Borden |
| 2010/0132780 A1 | 6/2010 | Kizilyalli et al. |
| 2010/0193002 A1 | 8/2010 | Dimroth et al. |
| 2010/0218819 A1 | 9/2010 | Farmer et al. |

(56) References Cited

U.S. PATENT DOCUMENTS

| | | | |
|---|---|---|---|
| 2010/0263707 A1* | 10/2010 | Cheong | C30B 23/02 136/244 |
| 2010/0270653 A1 | 10/2010 | Leitz et al. | |
| 2010/0294349 A1 | 11/2010 | Srinivasan et al. | |
| 2010/0294356 A1 | 11/2010 | Parikh et al. | |
| 2011/0083722 A1 | 4/2011 | Atwater et al. | |
| 2011/0088771 A1 | 4/2011 | Lin et al. | |
| 2011/0108098 A1 | 5/2011 | Kapur et al. | |
| 2011/0156000 A1 | 6/2011 | Cheng | |
| 2011/0189817 A1 | 8/2011 | Takahashi et al. | |
| 2011/0214728 A1 | 9/2011 | Veerasamy | |
| 2011/0244692 A1 | 10/2011 | Jeong et al. | |
| 2011/0259387 A1* | 10/2011 | Wu | H01L 31/068 136/244 |
| 2011/0290322 A1 | 12/2011 | Meguro et al. | |
| 2012/0024336 A1 | 2/2012 | Hwang | |
| 2012/0031478 A1 | 2/2012 | Boisvert et al. | |
| 2012/0055541 A1 | 3/2012 | Granek et al. | |
| 2012/0067423 A1 | 3/2012 | Lochtefeld et al. | |
| 2012/0090672 A1* | 4/2012 | Lebby | H01L 31/072 136/255 |
| 2012/0104411 A1 | 5/2012 | Iza et al. | |
| 2012/0125256 A1 | 5/2012 | Kramer et al. | |
| 2012/0132930 A1 | 5/2012 | Young et al. | |
| 2012/0160296 A1 | 6/2012 | Laparra et al. | |
| 2012/0164796 A1 | 6/2012 | Lowenthal et al. | |
| 2012/0227805 A1 | 9/2012 | Hermle et al. | |
| 2012/0247555 A1 | 10/2012 | Matsushita et al. | |
| 2012/0305059 A1 | 12/2012 | Kayes et al. | |
| 2013/0000708 A1* | 1/2013 | Bedell | H01L 31/0725 136/255 |
| 2013/0025654 A1 | 1/2013 | Bedell et al. | |
| 2013/0026481 A1 | 1/2013 | Xu et al. | |
| 2013/0048061 A1 | 2/2013 | Cheng et al. | |
| 2013/0112258 A1 | 5/2013 | Park et al. | |
| 2013/0153013 A1 | 6/2013 | Archer et al. | |
| 2013/0220396 A1 | 8/2013 | Janssen et al. | |
| 2013/0270589 A1 | 10/2013 | Kayes et al. | |
| 2013/0288418 A1 | 10/2013 | Wang et al. | |
| 2013/0337601 A1 | 12/2013 | Kapur et al. | |
| 2014/0076386 A1 | 3/2014 | King et al. | |
| 2014/0261611 A1 | 9/2014 | King et al. | |
| 2014/0263171 A1* | 9/2014 | Frantz | H01L 31/1896 216/40 |
| 2014/0312373 A1 | 10/2014 | Donofrio | |
| 2014/0326301 A1* | 11/2014 | Johnson | H01L 31/0687 136/255 |
| 2014/0345679 A1* | 11/2014 | Johnson | H01L 31/0687 136/255 |
| 2014/0373906 A1 | 12/2014 | Suarez et al. | |
| 2015/0034152 A1 | 2/2015 | Cornfeld | |
| 2015/0171261 A1 | 6/2015 | Domine | |
| 2015/0228835 A1 | 8/2015 | Kayes et al. | |
| 2015/0368833 A1 | 12/2015 | Farah | |
| 2015/0380576 A1* | 12/2015 | Kayes | H01L 31/02327 136/255 |
| 2016/0013350 A1* | 1/2016 | King | H01L 31/0725 136/255 |
| 2016/0155881 A1 | 6/2016 | France et al. | |
| 2017/0047471 A1 | 2/2017 | Ding et al. | |
| 2017/0148930 A1 | 5/2017 | Hu et al. | |

FOREIGN PATENT DOCUMENTS

| | | |
|---|---|---|
| CN | 102473743 | 5/2012 |
| CN | 103952768 | 7/2014 |
| EP | 0595634 | 5/1994 |
| EP | 2927968 | 10/2015 |
| GB | 2501432 | 10/2013 |
| GB | 2501432 A | 10/2013 |
| JP | 63211775 | 9/1988 |
| JP | 3285368 | 12/1991 |
| JP | 06244443 | 9/1994 |
| JP | 07007148 | 1/1995 |
| JP | 8130321 | 5/1996 |
| JP | H09213206 | 8/1997 |
| JP | 2012-99807 A | 4/2012 |
| KR | 100762772 | 10/2007 |
| WO | WO 02065553 | 8/2002 |
| WO | WO 2008100603 | 8/2008 |
| WO | WO 2016123074 | 8/2016 |

OTHER PUBLICATIONS

Aisaka et al "Enhancement of upconversion Luminescence of Er Doped A1203 Films by Ag Islands Films" (Apr. 1, 2008) Applied Physics Letters 92, 132105, pp. 1-3.

B. H. Floyd, et al., "AN N—AlGaAs P—GaAs Graded Heterojunction for High Concentration Ratios," pp. 81-86, IEEE, 1987.

Biteen et al. "Spectral Tuning of Plasmon-enhanced Silicon Quantum Dot Luminescence" (Mar. 31, 2006) Applied Physics Letters 88, 131109, pp. 1-3.

Chinese Office Action issued in Chinese Patent Application No. 201110329046.4 dated Jun. 23, 2016.

Dionne et al. "Highly Confined Photon Transport in Subwavelength Metallic Slot Waveguides" (Jun. 20, 2006) Nano Lett., vol. 6, No. 9, pp. 1928-1932.

Hiroshi Yamaguchi, et al., "Development Status of Space Solar Sheet", IEEE PVSC Proceedings, 2008.

International Search Report and Written Opinion issued in PCT/US2017/015387 dated May 8, 2017.

Lezec et al. "Negative Refraction at Visible Frequencies" (Apr. 20, 2007) Science, vol. 316, pp. 430-432.

M. M. Sanfacon et al, "Analysis of AlGaAs/GaAs Solar Cell Structures by Optical Reflectance Spectroscopy IEEE on Electron Devices", vol. 37, No. 2, Feb. 1990, pp. 450-454.

Pacifici et al. "Quantitative Determination of Optical Transmission through Subwavelength Slit Arrays in Ag films: The Essential role of Surface Wave Interference and Local Coupling between Adjacent Slits" (Oct. 22, 2007) Thomas J. Watson Lab. of Appl. Phys., pp. 1-4.

Park et al. "Surface Plasmon Enhanced Photoluminescence of Conjugated Polymers" (Apr. 17, 2007) Appl. Phys. Letters 90, 161107, pp. 1-3.

Peter A. Lewis, "Pigment Handbook vol. I: Properties and Economics, 2nd Edition", John Wiley & Sons, New York, pp. 790-791 (1988).

Pillai et al. "Enhanced emission from Si-based Light-emitting Diodes using Surface Plasmons" (Apr. 17, 2006) Applied Physics Letters, 88, 161102, pp. 1-3.

Q. M. Zhang et al., "Effects of Displaced p-n Junction of Heterojunction Bipolar Transistors", IEEE Transactions on Electron Devices, vol. 39, No. 11, Nov. 1992, pp. 2430-2437.

Tanabe et al "Direct-bonded GaAs/InGaAs Tandem Solar Cell" (Sep. 6, 2006) Appl. Phys. Lett. 89, 102106, pp. 1-3.

Tatsuya Takamoto, et al., "Paper-Thin InGaP/GaAs Solar Cells", IEEE PVSC Proceedings, pp. 1769-1772, 2006.

The Stranski—Krastanov Three Dimensional Island Growth Prediction on Finite Size Model to Othaman et al., 2008.

Van Wijngaarden et al "Direct Imaging of Propagation and Damping of Near-Resonance Surface Plasmon Polaritons using Cathodoluminescence Spectroscopy" (Jun. 1, 2006) Appl. Phys. Lett. 88, 221111, pp. 1-3.

"Volmer-Weber and Stranski-Krastanov InAs.As quantum dots emitting at 1.3um" by Tsatsul'nikov et al., Journal of Applied Physics, vol. 88, No. 11, Dec. 1, 2000.

Advisory Action dated Apr. 13, 2016 for U.S. Appl. No. 13/446,876 of Kayes, B.M. et al. filed Apr. 13, 2012.

Advisory Action dated Jul. 22, 2011, for U.S. Appl. No. 12/605,108 of Kizilyalli, I.C. et al. dated Nov. 23, 2009.

Corrected Notice of Allowability dated Dec. 9, 2015 for U.S. Appl. No. 14/452,393 of Ding, I.-K. et al. filed Aug. 5, 2014.

Corrected Notice of Allowability dated May 26, 2017, for U.S. Appl. No. 12/904,047 of Atwater, H. et al. filed Oct. 13, 2010.

Corrected Notice of Allowability dated Apr. 20, 2015 for U.S. Appl. No. 13/451,455 of Nie, H. et al. filed Jul. 19, 2012.

(56) References Cited

OTHER PUBLICATIONS

Corrected Notice of Allowability dated Aug. 17, 2015 for U.S. Appl. No. 13/451,455 of Nie, H. et al. filed Jul. 19, 2012.
Corrected Notice of Allowability dated Jun. 29, 2015 for U.S. Appl. No. 13/451,455 of Nie, H. et al. filed Jul. 19, 2012.
European Search Report dated Sep. 19, 2017 for European Patent Application No. 11187659.5, 11 pages.
Final Office Action dated Apr. 10, 2014 for U.S. Appl. No. 13/772,043 of Archer, M.J. et al. filed Feb. 20, 2013.
Final Office Action dated Apr. 20, 2017 for U.S. Appl. No. 13/446,876 of Kayes, B.M. et al. filed Apr. 13, 2012.
Final Office Action dated Apr. 26, 2012 for U.S. Appl. No. 12/605,108 of Kizilyalli, I.C. et al. dated Nov. 23, 2009.
Final Office Action dated Apr. 28, 2011 for U.S. Appl. No. 12/605,108 of Kizilyalli, I.C. et al. dated Nov. 23, 2009.
Final Office Action dated Aug. 14, 2014 for U.S. Appl. No. 13/354,175 of Higashi, G. et al. filed Jan. 19, 2012.
Final Office Action dated Feb. 1, 2016 for U.S. Appl. No. 12/904,047 of Atwater, H. et al. filed Oct. 13, 2010.
Final Office Action dated Feb. 8, 2016 for U.S. Appl. No. 13/772,043 of Archer, M.J. et al. filed Feb. 20, 2013.
Final Office Action dated Jan. 26, 2017, for Korean Patent Application No. KR-20127012346, 4 pages.
Final Office Action dated Jan. 29, 2016 for U.S. Appl. No. 13/446,876 of Kayes, B.M. et al. filed Apr. 13, 2012.
Final Office Action dated Mar. 4, 2016 for U.S. Appl. No. 14/696,106 of Kayes, Brendan M. filed Apr. 24, 2015.
Final Office Action dated Mar. 8, 2017 for U.S. Appl. No. 15/006,003 of Kayes, B.M. et al. filed Jan. 25, 2016.
Final Office Action dated Oct. 18, 2011, for U.S. Appl. No. 12/940,876 of Kizilyalli, I.C. et al. filed Nov. 10, 2010.
Final Office Action dated Oct. 28, 2016 for U.S. Appl. No. 14/846,675 of Kayes, B.M. et al. filed Sep. 4, 2015.
Final Office Action dated Sep. 11, 2017 for U.S. Appl. No. 12/904,047 of Atwater, H. et al. filed Oct. 13, 2010.
Final Office Action dated Sep. 16, 2011 for U.S. Appl. No. 12/940,861 of Kizilyalli, I.C. et al. filed Nov. 5, 2010.
Final Office Action dated Sep. 22, 2017 for U.S. Appl. No. 13/772,043 of Archer, M.J. et al. filed Feb. 20, 2013.
First Office Action dated Jun. 5, 2014, for Chinese Patent Application No. 201080046469 filed Oct. 14, 2010, 23 pages.
First Office Action dated Jun. 7, 2016 for Korean Patent Application No. KR-20127012346, 6 pages.
First Office Action dated Nov. 30, 2016 for Chinese Patent Application No. 201510475349.5, 21 pages.
Heckelmann, Stefan et al., "Investigations on AlxGa1-xAs Solar Cells Grown by MOVPE", IEEE Journal of Photovoltaics, IEEE, US, vol. 5, No. 1, Dec. 18, 2014, pp. 446-453.
Hobner, A.et al., "Novel cost-effective bifacial silicon solar cells with 19.4% front and 18.1% rear efficiency", Applied physics letters 70(8), 1997, pp. 1008-1010.
International Search Report and Written Opinion dated Jun. 1, 2010 for International Application No. PCT/US2009/061898.
International Search Report and Written Opinion dated Jun. 1, 2010 for International Application No. PCT/US2009/061906.
International Search Report and Written Opinion dated Jun. 1, 2010 for International Application No. PCT/US2009/061911.
International Search Report and Written Opinion dated Jun. 1, 2010 for International Application No. PCT/US2009/061914.
International Search Report and Written Opinion dated Jun. 1, 2010 for International Application No. PCT/US2009/061920.
International Search Report and Written Opinion dated Dec. 2, 2016 for International Patent Application No. PCT/US2016/052939, 12 pages.
International Search Report and Written Opinion dated May 23, 2016 for International Patent Application No. PCT/US2016/014866, 12 pages.
Kang, et al., "Ultra-thin Film Nano-structured Gallium Arsenide Solar Cells", Proc. of SPJE, vol. 9277, No. 927718 pp. 1-7.
Lenkeit, B. et al., "Excellent thermal stability of remote plasma-enhanced chemical vapour deposited silicon nitride films for the rear of screen-printed bifacial silicon solar cells", Solar energy materials and solar cells 65(1), 2001, pp. 317-323.
Mathews, Ian et al., "GaAs solar cells for Indoor Light Harvesting", 2014 IEEE 40th Photovoltaic Specialist Conference (PVSC), IEEE, Jun. 8, 2014, pp. 510-513.
McClelland, R.W. et al., "High-Efficiency Thin-Film GAAS Bifacial Solar Cells", Proceedings of IEEE Photovoltaic Specialists Conference, May 21, 1990, pp. 145-147.
McPheeters, et al., "Computational analysis of thin film JnGaAs/GaAs quantum well solar cells with backside light trapping structures", Optics Express, Vcol. 20, No. S6, Nov. 5, 2012, pp. A864-A878.
Mellor, et al., "A numerical study of Bi-periodic binary diffraction gratings for solar cell applications", Solar Energy Materials & Solar Cells 95, 2011, pp. 3527-3535.
Non-Final Office Action dated Apr. 7, 2016 for U.S. Appl. No. 14/846,675 of Kayes, B.M. et al. filed Sep. 4, 2015.
Non-Final Office Action dated Apr. 7, 2017 for U.S. Appl. No. 13/772,043 of Archer, M.J. et al. filed Feb. 20, 2013.
Non-Final Office Action dated Aug. 16, 2017 for U.S. Appl. No. 14/846,675 of Kayes, B.M. et al. filed Sep. 4, 2015.
Non-Final Office Action dated Aug. 19, 2011 for U.S. Appl. No. 12/605,108 of Kizilyalli, I.C. et al. dated Nov. 23, 2009.
Non-Final Office Action dated Jan. 16, 2014 for U.S. Appl. No. 12/904,047 of Atwater, H. et al. filed Oct. 13, 2010.
Non-Final Office Action dated Jan. 30, 2014 for U.S. Appl. No. 13/354,175 of Higashi, G. et al. filed Jan. 19, 2012.
Non-Final Office Action dated Jul. 16, 2015 for U.S. Appl. No. 13/446,876 of Kayes, B.M. et al. filed Apr. 13, 2012.
Non-Final Office Action dated Jul. 16, 2015 for U.S. Appl. No. 13/772,043 of Archer, M.J. et al. filed Feb. 20, 2013.
Non-Final Office Action dated Jul. 30, 2015 for U.S. Appl. No. 12/904,047 of Atwater, H. et al. filed Oct. 13, 2010.
Non-Final Office Action dated Jun. 28, 2016 for U.S. Appl. No. 13/446,876 of Kayes, B.M. et al. filed Apr. 13, 2012.
Non-Final Office Action dated Mar. 17, 2011 for U.S. Appl. No. 12/940,861 of Kizilyalli, I.C. et al. filed Nov. 5, 2010.
Non-Final Office Action dated Mar. 17, 2011, for U.S. Appl. No. 12/940,876 of Kizilyalli, I.C. et al. filed Nov. 10, 2010.
Non-Final Office Action dated May 11, 2017 for U.S. Appl. No. 14/692,647 of Kayes, Brendan M. et al. filed Apr. 21, 2015.
Non-Final Office Action dated May 31, 2016 for U.S. Appl. No. 12/904,047 of Atwater, H. et al. filed Oct. 13, 2010.
Non-Final Office Action dated Nov. 17, 2010 for U.S. Appl. No. 12/605,108 of Kizilyalli, I.C. et al. dated Nov. 23, 2009.
Non-Final Office Action dated Nov. 17, 2015 for U.S. Appl. No. 14/696,106 of Kayes, Brendan M. filed Apr. 24, 2015.
Non-Final Office Action dated Nov. 2, 2017 for U.S. Appl. No. 15/340,560 of Ding, I.-K. et al. filed Nov. 1, 2016.
Non-Final Office Action dated Sep. 22, 2016 for U.S. Appl. No. 15/006,003 of Kayes, B.M. et al. filed Jan. 25, 2016.
Non-Final Office Action dated Sep. 26, 2013 for U.S. Appl. No. 13/772,043 of Archer, M.J. et al. filed Feb. 20, 2013.
Notice of Allowance dated Aug. 12, 2014, for U.S. Appl. No. 12/940,876 of Kizilyalli, I.C. et al. filed Nov. 10, 2010.
Notice of Allowance dated Aug. 17, 2015 for U.S. Appl. No. 14/452,393 of Ding, I.-K. et al. filed Aug. 5, 2014.
Notice of Allowance dated Aug. 26, 2016 for U.S. Appl. No. 14/696,106 of Kayes, Brendan M. filed Apr. 24, 2015.
Notice of Allowance dated Dec. 20, 2017 for U.S. Appl. No. 14/692,647 of Kayes, Brendan M. et al. filed Apr. 21, 2015.
Notice of Allowance dated Jan. 2, 2015 for U.S. Appl. No. 13/354,175 of Higashi, G. et al. filed Jan. 19, 2012.
Notice of Allowance dated Jul. 13, 2014 for U.S. Appl. No. 12/940,861 of Kizilyalli, I.C. et al. filed Nov. 5, 2010.
Notice of Allowance dated Jul. 27, 2016 for U.S. Appl. No. 14/452,393 of Ding, I.-K. et al. filed Aug. 5, 2014.
Notice of Allowance dated Jun. 19, 2014 for U.S. Appl. No. 12/605,108 of Kizilyalli, I.C. et al. dated Nov. 23, 2009.
Notice of Allowance dated Jun. 2, 2015 for U.S. Appl. No. 13/354,175 of Higashi, G. et al. filed Jan. 19, 2012.

(56) References Cited

OTHER PUBLICATIONS

Notice of Allowance dated Mar. 4, 2016 for U.S. Appl. No. 14/452,393 of Ding, I.-K. et al. filed Aug. 5, 2014.
Notice of Allowance dated Oct. 20, 2016 for U.S. Appl. No. 12/904,047 of Atwater, H. et al. filed Oct. 13, 2010.
Notice of Allowance dated Feb. 27, 2015 for U.S. Appl. No. 13/451,455 of Nie, H. et al. filed Jul. 19, 2012.
Notice of Allowance dated Jan. 26, 2015 for U.S. Appl. No. 13/451,455 of Nie, H. et al. filed Jul. 19, 2012.
Notice of Allowance with Corrected Notice of Allowability dated Feb. 28, 2017 for U.S. Appl. No. 12/904,047 of Atwater, H. et al. filed Oct. 13, 2010.
Ohtsuka, H. et al., "Effect of light degradation on bifacial Si solar cells", Solar energy materials and solar cells 66(1), 2001, pp. 51-59.
Restriction Requirement dated Dec. 26, 2014 for U.S. Appl. No. 13/446,876 of Kayes, B.M. et al. filed Apr. 13, 2012.
Restriction Requirement dated Dec. 28, 2017 for U.S. Appl. No. 15/422,218 of Zhu, Y. et al. filed Feb. 1, 2017.
Restriction Requirement dated Dec. 9, 2015 for U.S. Appl. No. 14/846,675 of Kayes, B.M. et al. filed Sep. 4, 2015.
Restriction Requirement dated Jan. 22, 2013 for U.S. Appl. No. 12/904,047 of Atwater, H. et al. filed Oct. 13, 2010.
Restriction Requirement dated Jun. 22, 2016 for U.S. Appl. No. 15/006,003 of Kayes, B.M. et al. filed Jan. 25, 2016.
Restriction Requirement dated Nov. 18, 2016, for U.S. Appl. No. 14/692,647 of Kayes, Brendan M. et al. filed Apr. 21, 2015.
Restriction Requirement dated Oct. 24, 2014 for U.S. Appl. No. 13/705,064 of Kayes, B.M. et al. filed Dec. 4, 2012.
Search Report dated Jun. 5, 2014, for Chinese Patent Application No. 201080046469 filed Oct. 14, 2010, 2 pages.
Supplementary Search Report dated Sep. 18, 2017 for Chinese Patent Application No. 201510475349.5, 1 page.
U.S. Appl. No. 15/706,090 of Kayes, B.M. et al. filed Sep. 15, 2017.
U.S. Appl. No. 15/837,533 of Kayes, B.M. et al. filed Dec. 11, 2017.
Van Geelen, A. et al., "Epitaxial lift-off GaAs solar cell from a reusable GaAs substrate", Materials Science and Engineering: B, vol. 45, No. 1-3, Mar. 1997, pp. 162-171.
Yang, et al., "Ultra-Thin GaAs Single-Junction Solar Cells Integrated with an AlInP Layer for Reflective Back Scattering", (4 total pages).
Yazawa, Y. et al., "GaInP single-junction and GaInP/GaAs two-junction thin-film solar cell structures by epitaxial lift-off", Solar Energy Materials and Solar Cells, vol. 50, No. 1-4, 1998, pp. 229-235.
European Office Action corresponding to European Application No. 17703637.3, dated Sep. 9, 2019.

* cited by examiner

MULTI-JUNCTION OPTOELECTRONIC DEVICE WITH GROUP IV SEMICONDUCTOR AS A BOTTOM JUNCTION

CROSS-REFERENCE TO RELATED APPLICATIONS

The present application is a Divisional application of U.S. application Ser. No. 15/417,105, titled "MULTI-JUNCTION OPTOELECTRONIC DEVICE WITH GROUP IV SEMICONDUCTOR AS A BOTTOM JUNCTION," filed on Jan. 26, 2017, which claims the priority to U.S. Provisional Application No. 62/289,070, titled "MULTI-JUNCTION OPTOELECTRONIC DEVICE WITH GROUP IV SEMICONDUCTOR AS A BOTTOM JUNCTION"," filed on Jan. 29, 2016. U.S. application Ser. No. 15/417,105 is also a Continuation-in-Part of, and claims priority to, U.S. application Ser. No. 13/705,064, titled "MULTI-JUNCTION OPTOELECTRONIC DEVICE," filed on Dec. 4, 2012, which is a Continuation-in-Part of, and claims priority to, U.S. application Ser. No. 12/939,077, titled "OPTOELECTRONIC DEVICES INCLUDING HETEROJUNCTION LAYER," filed on Nov. 3, 2010 and U.S. application Ser. No. 12/605,108, titled "PHOTOVOLTAIC DEVICE," filed on Oct. 23, 2009. The disclosure of each of these prior applications is hereby incorporated in its entirety by reference.

FIELD OF THE DISCLOSURE

The present disclosure generally relates to optoelectronic semiconductor devices, and more particularly to multi-junction optoelectronic devices with Group IV semiconductor as a bottom junction and method of manufacturing the multi-junction optoelectronic devices.

BACKGROUND OF THE DISCLOSURE

There is a need for providing optoelectronic semiconductor devices, also referred simply as optoelectronic devices, that have improved efficiency when compared to the efficiency of conventional optoelectronic devices. These improved devices need to be, however, cost effective, easily implemented and/or adaptable to existing environments. The present disclosure describes various aspects of technical solutions that address such needs.

SUMMARY OF THE DISCLOSURE

A multi-junction optoelectronic device with Group IV semiconductor as a bottom junction and method of manufacturing the multi-junction optoelectronic device are disclosed. The method for fabricating a multi-junction optoelectronic device comprises providing a first p-n structure on a substrate, wherein the first p-n structure comprises a first base layer of a first semiconductor with a first bandgap such that a lattice constant of the first semiconductor matches a lattice constant of the substrate, and wherein the first semiconductor comprises a Group III-V semiconductor. The method further comprises providing a second p-n structure on the first p-n structure, wherein the second p-n structure comprises a second base layer of a second semiconductor with a second bandgap, wherein a lattice constant of the second semiconductor matches a lattice constant of the first semiconductor, and wherein the second semiconductor comprises a Group IV semiconductor. The method further comprises lifting the multi-junction optoelectronic device off the substrate, wherein the multi-junction optoelectronic device comprises the first p-n structure and the second p-n structure, and wherein the multi-junction optoelectronic device is a flexible device.

In another aspect of the disclosure, the multi-junction optoelectronic device comprises a first p-n structure, wherein the first p-n structure comprises a first base layer of a first semiconductor with a first bandgap such that a lattice constant of the first semiconductor matches a lattice constant of a substrate, and wherein the first semiconductor comprises a Group III-V semiconductor. The multi-junction optoelectronic device further comprises a second p-n structure formed by epitaxial growth on the first p-n structure, wherein the second p-n structure comprises a second base layer of a second semiconductor with a second bandgap, wherein a lattice constant of the second semiconductor matches a lattice constant of the first semiconductor, and wherein the second semiconductor comprises a Group IV semiconductor. The multi-junction optoelectronic device is lifted off the substrate and comprises the first p-n structure and the second p-n structure. The multi-junction optoelectronic device formed in this manner is a flexible device.

In yet another aspect of the disclosure, a multi-junction optoelectronic device comprises a first p-n structure having a first p-n junction and a second p-n junction, wherein the first p-n junction comprises a first single-crystalline Group III-V semiconductor with a first bandgap such that a lattice constant of the first single-crystalline Group III-V semiconductor matches a lattice constant of a substrate. The multi-junction optoelectronic device further comprises a second p-n structure formed by epitaxial growth on the first p-n structure, wherein the second p-n structure comprises a third p-n junction having a second single-crystalline Group IV semiconductor with a second bandgap, and wherein a lattice constant of the second single-crystalline Group IV semiconductor matches a lattice constant of the first single-crystalline Group III-V semiconductor. The multi-junction optoelectronic device is lifted off the substrate and comprises the first p-n structure and the second p-n structure. The multi-junction optoelectronic device formed in this manner is a flexible device. In an embodiment or implementation, the substrate comprises a GaAs wafer and the third p-n junction of the second p-n structure comprises a Group IV semiconductor made up of Si, Ge, Sn, or a combination therefore such that the Group IV semiconductor forms a bottom junction, away from the external light source, of the multi-junction optoelectronic device after the multi-junction optoelectronic device is separated from the substrate.

BRIEF DESCRIPTION OF THE DRAWINGS

So that the manner in which the above recited features and various aspects of the disclosure can be understood in detail, a more particular description of the disclosure, briefly summarized above, can be had by reference to various embodiments or implementations, some of which are illustrated in the appended figures. It is to be noted, however, that the appended figures illustrate only examples of embodiments or implementations of various aspects of this disclosure and are therefore not to be considered limiting of its scope, for the disclosure can admit to other equally effective embodiments or implementations.

DETAILED DESCRIPTION

Figure 1:
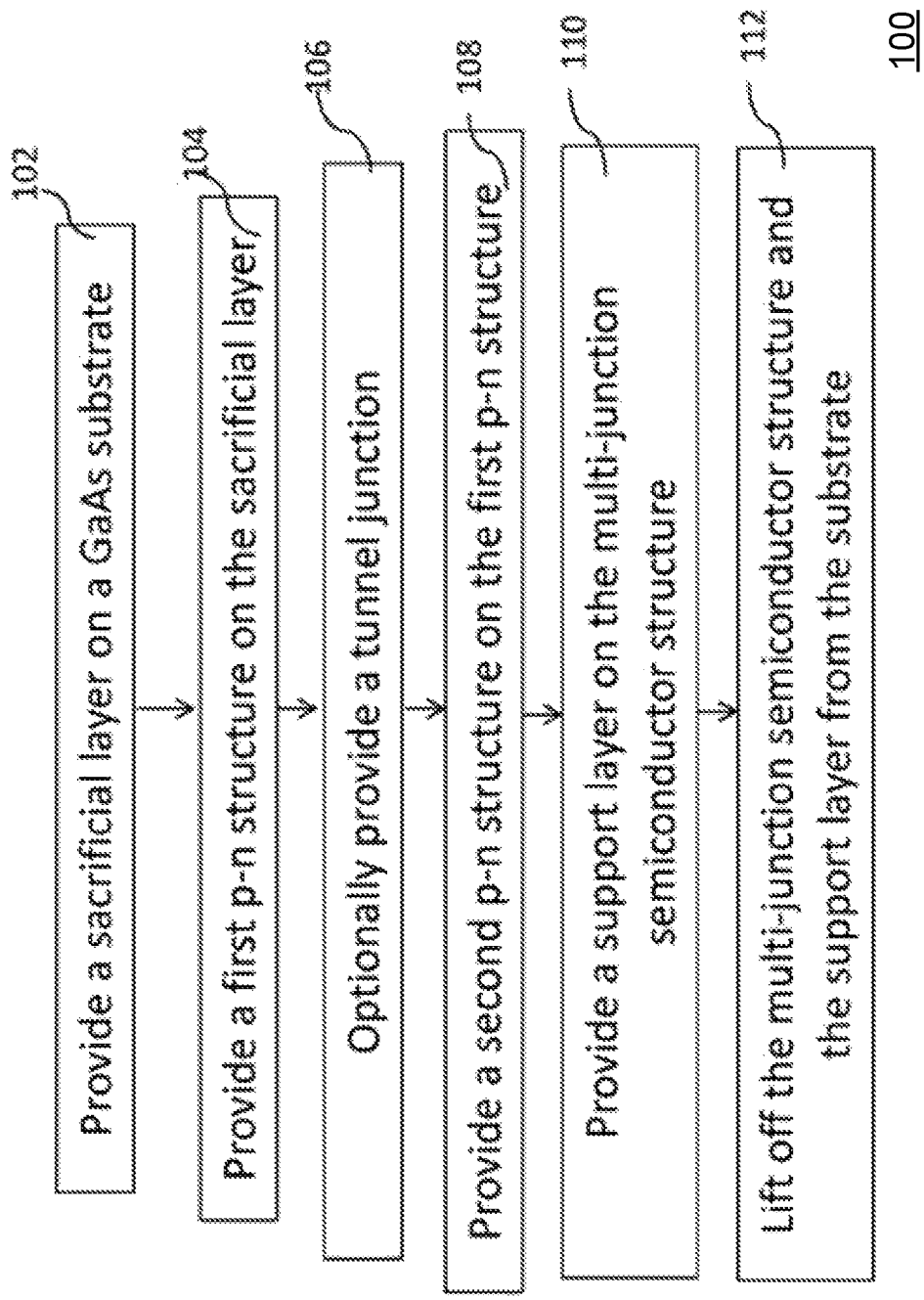
FIG. 1 is a flow chart illustrating a process of forming a multi-junction optoelectronic device with a p-n structure comprising Group IV semiconductor as a bottom junction using GaAs as a substrate according to various aspects described herein.

The present disclosure generally relates to optoelectronic semiconductor devices, also referred simply as optoelectronic devices, and more particularly to multi-junction optoelectronic devices with Group IV semiconductor as a bottom junction. The following description is presented to enable one of ordinary skill in the art to make and use the features and aspects of this disclosure and is provided in the context of a patent application and its requirements. Various modifications to the examples of embodiments and implementations provided and the generic principles and features described herein will be readily apparent to those skilled in the art. Thus, the present disclosure is not intended to be limited to the examples of embodiments or implementations shown but is to be accorded the widest scope consistent with the principles and features described herein.

As described above, the present disclosure relates to multi-junction optoelectronic devices with Group IV semiconductor as a bottom junction and the fabrication processes for forming such optoelectronic devices. Accordingly, the present disclosure describes various aspects of the fabrication of thin film devices, such as photovoltaic devices, light-emitting diodes (LEDs), or other optoelectronic devices, that can be used as the multi-junction optoelectronic devices described herein.

It is desirable to improve the performance of an optoelectronic device such as a photovoltaic cell or a light-emitting diode, for example, to improve the efficiency thereof without significantly affecting the cost or adding to overall size of the device. These devices should, therefore, be cost effective, easily implemented and/or adaptable to existing environments. The present disclosure describes various aspects of technical solutions that address such needs.

Generally, the performance of an optoelectronic device such as a photovoltaic cell (e.g., solar cell) or a light-emitting diode (LED) is improved by improving the light absorption/conversion efficiency of the cell or the light generation efficiency of the LED. High efficiency photovoltaic cells can be fabricated by growing materials with different band-gaps such that the highest band-gap material is on the light-facing side (e.g., front side) and the lowest band gap material is on the opposite side (e.g., back side). This results in the absorption of photons with different energy by different layers, improving the efficiency of the photovoltaic cell since this arrangement results in more photons being absorbed and thus generating a larger current. This can be achieved using different approaches; however, each approach has its own disadvantages.

Growing multiple layers of differing band gap materials (i.e., materials having different energy gaps) is desired for improving efficiency, but results in lattice mismatch between the growth substrate and different layers as well as between different layers, lowering the overall efficiency of the resulting photovoltaic cell (with similar inefficiencies arising in the operation of light-emitting diodes). Therefore, another approach is used to grow lattice-mismatched multi-junction optoelectronic devices (e.g., lattice-mismatched multi-junction solar cells) using a metamorphic graded layer to allow for difference in lattice constants, for example, using InGaAs as the bottom junction. The metamorphic approach leads to a lot of wasted metalorganic chemical vapor deposition (MOCVD) precursor material and reduced MOCVD tool throughput.

A different approach from the ones described above is to grow lattice-matched multi-junction optoelectronic devices using Ge as the bottom junction. Ge is widely used as a bottom cell (e.g., to provide a bottom junction) of GaAs-based multi-junction optoelectronic devices. However, since Ge has a lower than optimal bandgap, using Ge can result in substantial reduction in the conversion efficiency. Also, there is a small lattice mismatch between Ge and GaAs. To overcome these issues, the semiconductor In is sometimes added to GaAs to form InGaAs to improve lattice matching to a Ge substrate. However, this technique of using InGaAs may not work if the substrate is GaAs instead since the lattice constant of InGaAs and that of GaAs differ significantly resulting in lattice mismatch between these two materials.

The use of Group IV elements, also referred to as Group IV semiconductors, comprising a combination of Si, Ge, and/or Sn as a bottom cell of GaAs-based multi-junction optoelectronic devices can achieve a better lattice match. For example, a better match can be achieved between the lattice constant of SiGe and that of the GaAs substrate than Ge substrate. In addition, the band gap of SiGe is closer to the optimal band gap for efficiency in GaAs-based multi-junction optoelectronic devices. Therefore, SiGe, including lattice-mismatched SiGe, can be used to increase the band gap to improve the efficiency of the multi-junction optoelectronic devices.

Various aspects of a method for forming a multi-junction optoelectronic device comprising a Group IV semiconductor as a bottom cell (e.g., to provide a bottom junction) according to various aspects of the disclosure are described herein.

In this disclosure, in an embodiment or implementation, SiGe can be used as the bottom cell of a GaAs-based multi-junction optoelectronic device to achieve better lattice matching to a GaAs substrate as well as higher band-gap for improved efficiency.

Many of the thin film devices described herein (e.g., multi-junction optoelectronic devices such as photovoltaic cells or LEDs) generally contain epitaxially grown layers which are formed on a sacrificial layer disposed on or over a support substrate or wafer. The thin film devices thus formed can be flexible single crystal devices. Once the thin film devices are formed by epitaxy processes, the thin film devices are subsequently removed or separated from the support substrate or wafer, for example during an epitaxial lift off (ELO) process, a laser lift off (LLO) process, or a spalling process etc.

As used in this disclosure, a layer can be described as being deposited "on or over" one or more other layers. This term indicates that the layer can be deposited directly on top of the other layer(s), or can indicate that one or more additional layers can be deposited between the layer and the other layer(s) in some embodiments or implementations. Also, the other layer(s) can be arranged in any order. To describe the features of the present disclosure in more detail reference is made to the following discussion in conjunction with the accompanying figures.

FIG. 1 is a flow chart illustrating an example of a method 100 for fabricating or forming a multi-junction optoelectronic device. In the example shown in FIG. 1, the multi-junction optoelectronic device includes a p-n structure comprising a Group IV semiconductor as a bottom junction using GaAs as a substrate according to various aspects described herein. In an embodiment or implementation, the method 100 comprises, at 102 providing a sacrificial layer on a GaAs substrate, at 104 providing a first p-n structure on the sacrificial layer, at 106 optionally providing a tunnel junction, at 108 providing a second p-n structure on the first p-n structure, at 110 providing a support layer on the multi-junction optoelectronic device (or multi-junction semiconductor structure), and at 112 lifting off the multi-junction optoelectronic device and the support layer from the substrate. In an embodiment or implementation, the multi-junction optoelectronic device can be lifted off of the substrate whether a support layer is provided or not. In an aspect of the method 100, a first p-n structure can be provided on a GaAs substrate (or on a sacrificial layer on a GaAs substrate) as indicated at 104 in FIG. 1. A p-n structure can refer to a structure having one or more semiconductor layers and where one or more p-n junctions are formed with the one or more semiconductor layers.

In some embodiments or implementations, the sacrificial layer can be disposed on the substrate (e.g., at 102 in FIG. 1) prior to deposition of the p-n structure, for example, to enable liftoff or separation of the p-n structure by using an epitaxial liftoff (ELO) process or other similar process. The sacrificial layer can comprise AlAs, AlGaAs, AlGaInP, or AlInP, or other layers with high Al content, or combinations thereof and is utilized to form a lattice structure for the layers contained within the cell, and then etched and removed during the ELO process. In other embodiments, alternative liftoff processes such as laser lift off (LLO), ion implantation and liftoff, liftoff by etching of a buried oxide layer or a buried porous layer, or spalling can be used.

In an embodiment or implementation, the first p-n structure can be grown on a substrate (e.g., on the sacrificial layer on the substrate), for example, a GaAs wafer can be used, with epitaxially grown layers as thin films made of Group III-V materials (e.g., Group III-V semiconductors). The first p-n structure can be formed by epitaxial growth using various techniques, for example, metalorganic chemical vapor deposition (MOCVD), molecular beam epitaxy (MBE), metalorganic vapor phase epitaxy (MOVPE or OMVPE), liquid phase epitaxy (LPE), hydride vapor phase epitaxy (HYPE), close-spaced vapor transport (CSVT) epitaxy, etc. In some embodiments the first p-n structure is substantially a single crystal. The first p-n structure can include a single-crystalline semiconductor material.

In some embodiments or implementations, the epitaxially grown layers of Group III-V materials can be formed using a high growth rate deposition process (e.g., a high growth rate vapor deposition process). The high growth rate deposition process is such that grown materials are of sufficient quality for use in the types of optoelectronic devices described herein. The high growth rate deposition process allows for growth rates of greater than 5 μm/hr, such as about 10 μm/hr or greater, or as high as about 100 μm/hr or greater. For example, the growth rates can be about 10 μm/hr, about 20 μm/hr, about 30 μm/hr, about 40 μm/hr, about 50 μm/hr, about 60 μm/hr, about 70 μm/hr, about 80 μm/hr, about 90 μm/hr, or about 100 μm/hr, some specific rate between any two of these values (e.g., about 25 μm/hr— between 20 μm/hr and 30 μm/hr), or some range between any two of these values (e.g., range from about 20 μm/hr to about 30 μm/hr). In some embodiments or implementations, the high growth rate deposition process allows for growth rates of greater than 100 μm/hr, including growth rates of about 120 μm/hr. The term "about" as used in this disclosure can indicate a variation of 1%, 2%, 3%, 4%, 5%, or 10%, for example, from a nominal value. The high growth rate deposition process includes heating a wafer to a deposition temperature of about 550° C. or greater (e.g., the deposition temperature can be as high as 750° C. or 850° C.), within a processing system, exposing the wafer to a deposition gas containing a chemical precursor, such as a Group III-containing precursor gas and a Group V-containing precursor gas, and depositing a layer containing a Group III-V material on the wafer. The Group III-containing precursor gas can contain a Group III element, such as indium, gallium, or aluminum. For example, the Group III-containing precursor gas can be one of trimethyl aluminum, triethyl aluminum, trimethyl gallium, triethyl gallium, trimethyl indium, triethyl indium, di-isopropylmethylindium, or ethyldimethylindium. The Group V-containing precursor gas can contain a Group V element, such as nitrogen, phosphorus, arsenic, or antimony. For example, the Group V-containing precursor gas can be one of phenyl hydrazine, dimethylhydrazine, tertiarybutylamine, ammonia, phosphine, tertiarybutyl phosphine, bisphosphinoethane, arsine, tertiarybutyl arsine, monoethyl arsine, trimethyl arsine, trimethyl antimony, triethyl antimony, or tri-isopropyl antimony, stibine.

The deposition processes for depositing or forming Group III-V materials, as described herein, can be conducted in various types of deposition chambers. For example, one continuous feed deposition chamber that can be utilized for growing, depositing, or otherwise forming Group III-V materials, is described in the commonly assigned U.S. patent application Ser. Nos. 12/475,131 and 12/475,169 (issued as U.S. Pat. No. 8,602,707), both filed on May 29, 2009, which are herein incorporated by reference in their entireties.

Some examples of layers usable in device and methods for forming such layers are disclosed in commonly assigned U.S. Pat. No. 9,136,418, issued Sep. 15, 2015, and U.S. Pat. No. 9,178,099, issued Nov. 3, 2015, and incorporated herein by reference in their entirety.

In an embodiment or implementation, the first p-n structure comprises multiple p-n junctions, for example, a first p-n junction, a second p-n junction up to an nth p-n junction. That is, the first p-n structure can include one, two, or more p-n junctions. In one example, the first p-n structure includes only one p-n junction. Each of the first through n−1th p-n junction can contain various arsenide, phosphide, and nitride layers, such as AlGaAs, InGaAs, AlInGaAsP, AlInP, InGaP, AlInGaP, GaP, GaN, InGaN, AlGaN, AlInGaN, alloys thereof, derivatives thereof, or combinations thereof. For example, the nitride and phosphide layers can include one or more of InGaP, AlInGaP, GaN, InGaN, AlGaN, AlInGaN, GaP, alloys of any of these, or derivatives of any of these. The nth p-n junction can contain various arsenide, phosphide, and nitrade layers, such as GaAs, AlGaAs, InGaAs, AlInGaAs, InGaAsP, AlInGaAsP, GaN, InGaN, alloys thereof, derivatives thereof and combinations thereof. In general each of these p-n junctions comprises a Group III-V semiconductor and includes at least one of gallium, aluminum, indium, phosphorus, nitrogen, or arsenic.

In an embodiment or implementation, the first p-n junction of the first p-n structure comprises indium gallium phosphide material or derivatives thereof. The indium gallium phosphide material can contain various indium gallium phosphide layers, such as an indium gallium phosphide, aluminum indium gallium phosphide, etc. For example, in one embodiment or implementation, the first p-n structure comprises a p-type aluminum indium gallium phosphide layer or stack disposed above an n-type indium gallium phosphide layer or stack, where the combination of these two stacks can form the first p-n junction. As described in this disclosure, a stack can refer to a set of one or more layers such that an n-type stack includes a set of one or more layers of which at least one of the layers in the set is an n-type layer or includes an n-type material, while a p-type stack includes a set of one or more layers of which at least one of the layers in the set is an p-type layer or includes an p-type material.

In one example, the p-type aluminum indium gallium phosphide stack has a thickness within a range from about 100 nm to about 3,000 nm and the n-type indium gallium phosphide stack has a thickness within a range from about 100 nm to about 3,000 nm. In one example, the n-type indium gallium phosphide stack has a thickness within a range from about 400 nm to about 1,500 nm.

In another embodiment or implementation, the first p-n junction of the first p-n structure comprises aluminum indium gallium phosphide material or derivatives thereof. The aluminum indium gallium phosphide material can contain various aluminum indium gallium phosphide layers, such as an aluminum indium phosphide, aluminum indium gallium phosphide, etc. For example, in one embodiment or implementation, the p-n structure comprises a p-type aluminum indium phosphide layer or stack disposed above an n-type aluminum indium gallium phosphide layer or stack, where the combination of these two stacks can form the first p-n junction.

In an embodiment the first p-n junction, the second p-n junction, or the nth p-n junction of the first p-n structure comprises gallium arsenide material, and derivatives thereof, for example, GaAs, AlGaAs, InGaAs, AlInGaAs, InGaAsP, AlInGaAsP, alloys thereof, derivatives thereof and combinations thereof. The gallium arsenide material can contain various gallium arsenide layers, such as gallium arsenide, aluminum gallium arsenide, indium gallium arsenide, aluminum indium gallium arsenide etc. For example, in one embodiment the nth p-n junction comprises a p-type aluminum gallium arsenide layer or stack disposed above an n-type gallium arsenide layer or stack.

In an embodiment or implementation, the first p-n junction, the second p-n junction, or the nth p-n junction of the first p-n structure comprises gallium phosphide material, and derivatives thereof, for example, GaP, InGaP, AlInP, AlGaP, AlInGaP, InGaAsP, AlInGaAsP, alloys thereof, derivatives thereof, and combinations thereof.

For some embodiments or implementations, an interface or intermediate layer can be formed between an emitter layer and a base layer (e.g., between emitter and base layers in a p-n junction or a p-n structure). The intermediate layer can comprise any suitable Group III-V compound semiconductor, such as GaAs, AlGaAs, InGaP, AlInGaP, InGaAsP, AlInGaAsP, AlInP, or a combination thereof. The intermediate layer can be n-doped, p-doped, or not intentionally doped. The thickness of the interface layer can be in the range of about 5 nm to about 200 nm, for example. The intermediate layer is located between a p-doped layer and an n-doped layer, and can be comprised of the same material as either the n-doped layer or the p-doped layer, or can be comprised of a different material from either the n-doped layer or the p-doped layer, and/or can a layer of a graded composition. The intermediate layer thus formed can provide a location offset for one or more heterojunctions from a corresponding p-n junction. Such an offset can allow for reduced dark current within the device, improving its performance.

In an embodiment or implementation, the second p-n structure can be grown on the first p-n structure (as shown in 106 in FIG. 1). The second p-n structure can include epitaxially grown layers as thin films made of Group IV materials (e.g., Group IV semiconductors). The second p-n structure can be formed by epitaxial growth using different techniques, for example, plasma enhanced chemical vapor deposition (PECVD), physical vapor deposition (PVD), or atmospheric pressure chemical vapor deposition (APCVD). Other techniques that can be used to form the second p-n structure include sputtering, atomic layer deposition (ALD), hydride vapor phase epitaxy (HVPE), metalorganic vapor phase epitaxy (MOVPE or OMVPE), metalorganic chemical vapor deposition (MOCVD), inductively coupled plasma enhanced chemical vapor deposition (ICP-CVD), hot-wire chemical vapor deposition (HWCVD), low pressure chemical vapor deposition (LPCVD), and other forms of chemical vapor deposition (CVD). In some embodiments or implementations, the second p-n structure is substantially a single crystal (e.g., the second p-n structure can include a single-crystalline semiconductor material). To achieve this, the first p-n structure after growth is transferred to another chamber along with the growth substrate to grow the second p-n structure on top of the first p-n structure using another growth process such as PECVD, PVD, or APCVD. The high growth rate deposition process allows for growth rates of greater than 5 μm/hr, such as about 10 μm/hr or greater, or as high as about 100 μm/hr or greater. For example, the growth rates can be about 10 μm/hr, about 20 μm/hr, about 30 μm/hr, about 40 μm/hr, about 50 μm/hr, about 60 μm/hr, about 70 μm/hr, about 80 μm/hr, about 90 μm/hr, or about 100 μm/hr, some specific rate between any two of these values (e.g., about 25 μm/hr—between 20 μm/hr and 30 μm/hr), or some range between any two of these values (e.g., range from about 20 μm/hr to about 30 μm/hr).). In some embodiments or implementations, the high growth rate deposition process allows for growth rates of greater than 100 μm/hr, including growth rates of about 120 μm/hr.

In an embodiment or implementation, the method 100 can include providing a first junction (e.g., p-n junction) of the first p-n structure, (e.g., InGaP) on a substrate (e.g., GaAs) via step 102. Additional p-n junctions can be grown on the first p-n junction, for example, GaAs. In an embodiment or implementation, the first p-n junction can contain various arsenide, nitride, and phosphide layers, such as GaAs, AlGaAs, InGaP, AlInGaP, GaN, InGaN, AlGaN, AlInGaN, GaP, alloys thereof, derivatives thereof and combinations thereof and the additional p-n junctions can comprise any of GaAs, AlGaAs, InGaP, AlInGaP, InGaAs, AlInGaAs, InGaAsP, AlInGaAsP, alloys thereof, derivatives thereof and combinations thereof.

The first p-n structure thus formed is transferred to another growth chamber and a second p-n structure, for example, SiGe is then formed on the first p-n structure at 108. In this embodiment or implementation, the lattice constant of the substrate matches the lattice constant of the first p-n structure and the lattice constant of the second p-n structure matches the lattice constant of the first p-n structure. One of ordinary skill can recognize that such matching of lattice constants also includes materials with lattice constants nearly matching each other. For example, a semiconductor material of the substrate can have a lattice constant that matches (or substantially matches) that of a first semiconductor material of the first p-n structure, and the lattice constant of the first semiconductor material matches (or substantially matches) that of a second p-n structure. Matching or substantially matching of lattice constants refers to allowing two different and adjacent semiconductor materials a region of band gap change to be formed without introducing a change in crystal structure. As described above, the method 100 further comprises optionally providing a tunnel junction at 106 between the multiple p-n junctions within the first p-n structure and/or the second p-n structure, or between the first p-n structure and the second p-n structure, forming a multi-junction semiconductor structure for a multi-junction optoelectronic device. The tunnel junction provides electrical coupling between the multiple p-n junctions within the first p-n structure and/or the second p-n structure, or between the first p-n structure and the second p-n structure and/or the rest of the device. The other p-n junctions within the first p-n structure and the second p-n structure are voltage generating p-n junctions of the multi-junction semiconductor structure. The tunnel junctions can be grown based on Group III-V materials by using the same or similar equipment and techniques as described herein to grow the first p-n structure, or the tunnel junction can be grown based on Group IV materials by using the same or similar equipment and techniques as described herein to grow the second p-n structure. In another embodiment or implementation, the tunnel junction can be based on Group III_V materials and Group IV materials, possibly grown using more than one technique. In this case, it is possible to, for example, end the growth of the Group III-V material with a highly doped layer or surface of n-doping or p-doping, and then begin the growth of the Group IV material with a highly doped layer of the opposite doping type.

In an embodiment or implementation, the second p-n structure comprises a Group IV semiconductor such as but not limited to Si, Ge, Sn, C, or mixtures of two or more of these materials, wherein a p-type silicon germanium layer or stack is disposed above an n-type silicon germanium layer or stack. In one example, the p-type silicon germanium stack has a thickness within a range from about 100 nm to about 3,000 nm and the n-type silicon germanium stack has a thickness within a range from about 100 nm to about 3,000 nm. In one example, the n-type silicon germanium stack has a thickness within a range from about 700 nm to about 2,500 nm.

In another embodiment or implementation, the second p-n structure comprises multiple p-n junctions. Each p-n junction can contain various Group IV semiconductor layers, which can be grown using different source materials including, but not limited to, isobutylgermane, alkylgermanium trichlorides, dimethylaminogermanium trichloride, germane, silane, disilane, silicon tetrachloride, carbontetrabromide, carbontribromidechloride, etc. In general, each p-n junction comprises a Group IV semiconductor materials and includes at least one of silicon, germanium, tin, and carbon, and mixtures of two or more of these materials.

Furthermore, for both, the first p-n structure and the second p-n structure, the junction formed between the two layers can be a heterojunction that is, the N-layer and P-layer that form the junction could be made of different materials, or a homojunction, that is, both the N-layer and P-layer that form the junction could be made of the same material, for example, both layers being GaAs or both layers InGaP. Also the p-n structure could have either doping polarity, with the n-type material at the top of the structure or junction and the p-type material at the bottom of the structure or junction, or alternatively, the p-type material at the top of the structure or junction and n-type material at the bottom of the structure or junction.

In some embodiments or implementations, one or more of the first p-n structure or the second p-n structure can comprise a textured surface. This textured surface can improve the scattering of light at that surface, as well as improve adhesion to both metal and dielectric layers. In some embodiments or implementations, the texturing of the surface can be achieved during the growth of the materials that comprise the p-n structure. This can be achieved at least in part by using a lattice mismatch between at least two materials in the p-n structure, for example in a Stranski-Krastanov process or a Volmer-Weber process, to produce texturing at the interface between the materials. In another embodiment or implementation, a layer in or on the p-n structure can act as an etch mask and texturing can be provided by an etching process. In yet another embodiment or implementation, texturing can be provided by physical abrasion such as sandpaper or sandblasting or particle blasting or similar processes. In yet another embodiment or implementation, texturing can be provided by an inhomogeneous etching process that produces microscopically non-uniform features on a surface. Moreover, texturing can be accomplished using techniques similar to those used in silicon texturing, including, for example, "random pyramid" or "inverted pyramid" etching using, for example, KOH.

In addition, in an embodiment or implementation, the back side and/or the front side (e.g., the side closest to where light is received by a photovoltaic cell or emitted by an LED) of the p-n structure can be textured to improve light scattering into and/or out of the device. In some embodiments or implementations, texturing can be more likely applied to the back side (e.g., back-side texturing), in which case that Group IV semiconductor materials are to be textured using one or more of the texturing techniques described above.

A support layer can then be deposited on the multi-junction semiconductor structure thus formed at 110 in FIG. 1. The support layer can comprise one or more of a dielectric layer, a semiconductor contact layer (or simply contact layer), a passivation layer, a transparent conductive oxide layer, an anti-reflective coating, a metal coating, an adhesive layer, an epoxy layer, or a plastic coating. In an embodiment or implementation, the support layer is composed of one or more materials that have a chemical resistance to acids, for example, to acids that are used as part of an ELO or similar process.

In those instances in which a dielectric layer is included as part of a support layer, the dielectric layer comprises dielectric materials that are organic or inorganic. The organic dielectric materials comprise any of polyolefin, polycarbonate, polyester, epoxy, fluoropolymer, derivatives thereof and combinations thereof and the inorganic dielectric materials comprise any of arsenic trisulfide, arsenic selenide, α-alumina (sapphire), magnesium fluoride, derivatives thereof and combinations thereof.

In those instances in which a contact layer (or multiple contact layers) is included as part of a support layer, the contact layer can contain Group III-V materials, such as gallium arsenide (GaAs), depending on the desired composition of the final photovoltaic unit. According to embodiments or implementations described herein, the contact layer can be heavily n-doped. In some embodiments or implementations, the doping concentration can be within a range greater than about $5\times10^{18}$ cm$^{-3}$, for example, from greater than about $5\times10^{18}$ cm$^{-3}$ to about $1\times10^{19}$ cm$^{-3}$. The high doping of the contact layer allows an ohmic contact to be formed with a later-deposited metal layer without any annealing step performed to form such an ohmic contact, as described below.

In some embodiments or implementations, the contact layer can be gallium arsenide (GaAs) doped with silicon (Si). For example, in some embodiments or implementation in which a high-growth rate, as described above, is used to form the layers of the structure, a silicon dopant (as an n-dopant) can be used to bring the doping concentration to $5\times10^{18}$ cm$^{-3}$ or greater. For example, a precursor disilane can be introduced in a fast growth rate process to deposit the silicon dopant. In other embodiments or implementations, selenium (Se) or tellurium (Te) can be used as a dopant in the formation of the layers of structure.

The contact layer can be formed at a thickness of about 10 nm or greater, such as about 50 nm. In some embodiments or implementations, the contact layer can be formed prior to an ELO process that separates the structure from the growth wafer. In some alternative embodiments or implementations, the contact layer can be formed at a later stage subsequent to such an ELO process. In the various examples of embodiments or implementations described herein, the contact layers used can include one or more of an n-metal alloy contact, a p-metal contact, an n-metal contact, a p-metal alloy contact, or other suitable contacts as described in U.S. patent application Ser. No. 12/939,050, entitled, "Metallic Contacts for Photovoltaic Devices and Low-Temperature Fabrication Processes Thereof," filed on Nov. 3, 2010, and which is incorporated herein by reference. Other types, structures, and materials of metal contact layers can also be used with the various types of optoelectronic devices described in this disclosure.

The multi-junction semiconductor structure or multi-junction optoelectronic device and the support layer can then lifted off (e.g., separated, removed) the substrate as shown at 112 in FIG. 1.

Embodiments or implementations of such multi-junction optoelectronic devices can also provide back reflectors, also known as reflective back contacts, which are metallic reflectors or metal-dielectric reflectors. These reflective back contacts can be deposited either before after the device is lifted off and can comprise one or more of silver, aluminum, gold, platinum, copper, nickel, or alloys thereof. The layer with the reflective back contacts can have a thickness within a range from about 0.01 μm to about 1 μm, preferably, from about 0.05 μm to about 0.5 μm, and more preferably, from about 0.1 μm to about 0.3 μm, for example, about 0.2 μm or about 0.1 μm (1,000 Å). The layer with the reflective back contacts can be deposited by a vapor deposition process, such as physical vapor deposition (PVD), sputtering, electron beam deposition (e-beam), ALD, CVD, PE-ALD, or PE-CVD, or by other deposition processes including inkjet printing, screen printing, evaporation, electroplating, electroless deposition (e-less), or combinations thereof. Aspects of the reflective back contacts are described in U.S. patent application Ser. No. 12/939,050. Other types, structures, and materials of metal contact layers can also be used with the various types of optoelectronic devices described in this disclosure.

Figure 2:
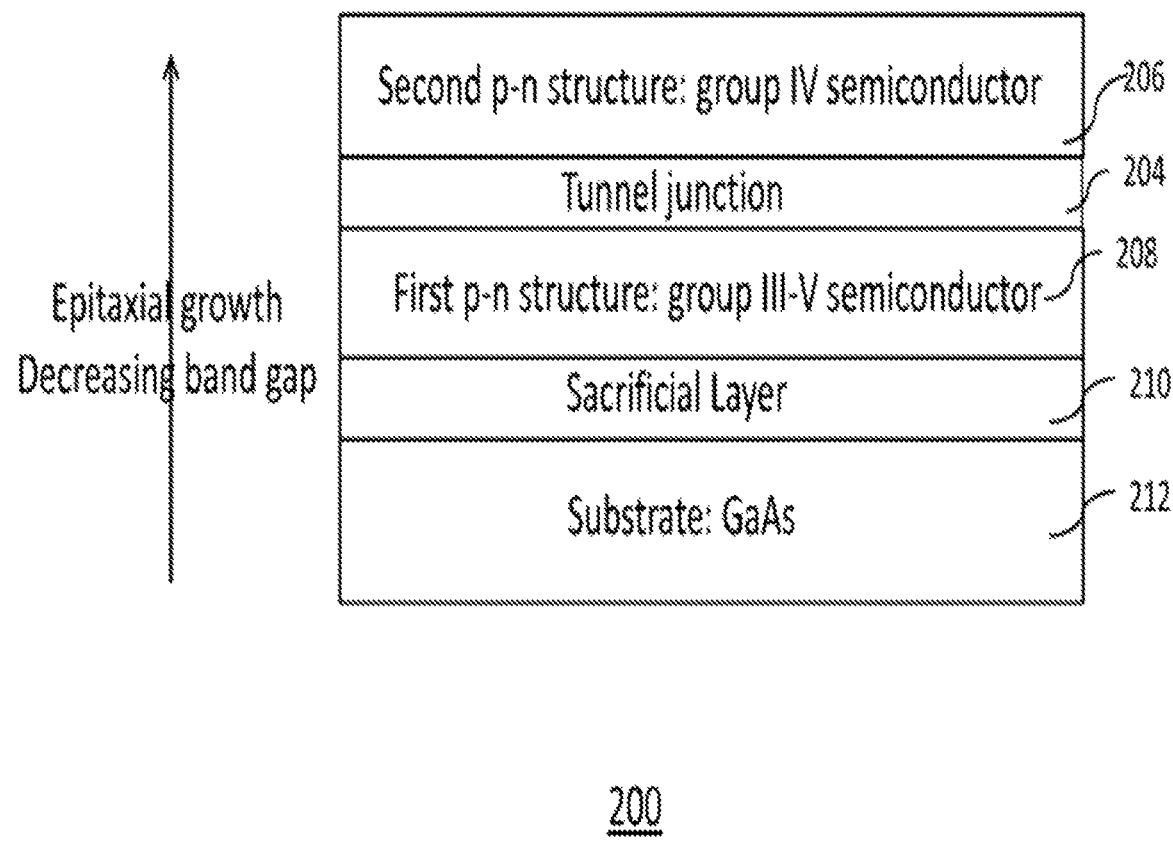
FIG. 2 illustrates an example of a multi-junction optoelectronic device with a p-n structure comprising Group IV semiconductor as a bottom junction using GaAs as a substrate before the device is separated from the substrate, in accordance with various aspects of the disclosure.

FIG. 2 illustrates an example of an embodiment or implementation of a multi-junction optoelectronic device 200 with a p-n structure comprising Group IV semiconductor as a bottom junction and using GaAs as a substrate before the device is separated from the substrate according to the present disclosure. In an embodiment or implementation, the multi-junction optoelectronic device 200 is epitaxially grown as sunny side down with decreasing band gap from the first p-n junction of the first p-n structure to the last junction of the second p-n structure. For example, as illustrated in FIG. 2, the multi-junction optoelectronic device 200 is epitaxially grown sunny side down with decreasing band gap from the first p-n structure 208 to the second p-n structure 206 where the first p-n structure 208 comprises one or more p-n junctions further comprising Group III-V semiconductor material such as InGaP and GaAs, the second p-n structure 206 comprises a p-n junction further comprising Group IV semiconductor material such as SiGe or SiGeSn. In an embodiment or implementation, the second p-n structure 206 may include more than one p-n junction. A tunnel junction 204 is optionally provided between the first p-n structure 208 and the second p-n structure 206. A sacrificial layer 210, such as a layer made of AlGaAs or AlAs, can be disposed on the GaAs substrate 212 prior to deposition of the first p-n structure 208. The sacrificial layer 210 may be provided to enable liftoff of the multi-junction structure formed by the first p-n structure, the second p-n structure, and optionally the tunnel junction, using an epitaxial liftoff (ELO) process.

Figure 3:
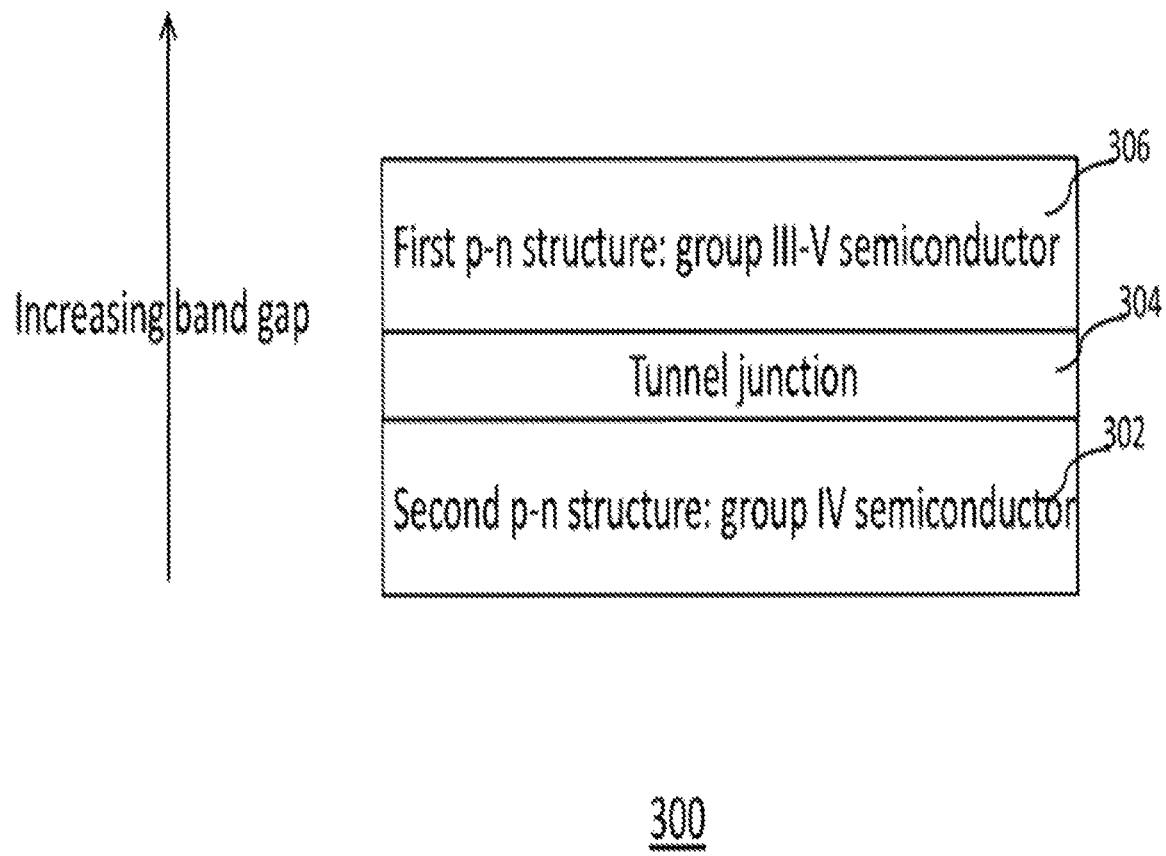
FIG. 3 illustrates another example of a multi-junction optoelectronic device with a p-n structure comprising Group IV semiconductor as a bottom junction using GaAs as a substrate after the device is separated from the substrate, in accordance with various aspects of the disclosure.

FIG. 3 illustrates an example of an embodiment or implementation of a multi-junction optoelectronic device 300 with second p-n structure comprising Group IV semiconductor as a bottom junction and using GaAs as a substrate after the device is separated from the substrate according to the present disclosure. In an embodiment or implementation, the multi-junction optoelectronic device 300 is shown as sunny side up with increasing band gap from the second p-n structure 302 to first p-n structure 306 where the first p-n structure 306 comprises one or more p-n junctions.

More generally, for the multi-junction optoelectronic device 300 in FIG. 3 the first p-n structure 306 comprises a Group III-V semiconductor and the second p-n structure 302 comprises a Group IV semiconductor such as SiGe, for example. The first p-n structure 306 can further comprise a first p-n junction and a second p-n junction. In a non-limiting example, the first p-n junction comprises an InGaP semiconductor material and the second p-n junction comprises a GaAs semiconductor material. Other examples may have the first p-n junction and the second p-n junction made of different Group III-V semiconductor than those in the example described above. A tunnel junction 304 is optionally provided between the first p-n structure 306 and the second p-n structure 302. This results in an optoelectronic device where the second p-n structure 302 comprises a Group IV semiconductor material, such as SiGe, for example, which forms the bottom cell or junction of the multi-junction structure of the multi-junction optoelectronic device 300, and where the bottom cell or junction is away from the incident light after the device is separated from the substrate.

In an embodiment or implementation, the first p-n structure 306 and/or the second p-n structure 302 can comprise one or more p-n junctions grown in decreasing order of band gap (e.g., from largest energy gap to smallest energy gap) such that after the separation of the device from the substrate, the p-n junction away from the side of the device receiving the incident light has the smallest band gap and the p-n junction closest to the side of the device receiving the incident light has the largest band gap.

Figure 4:
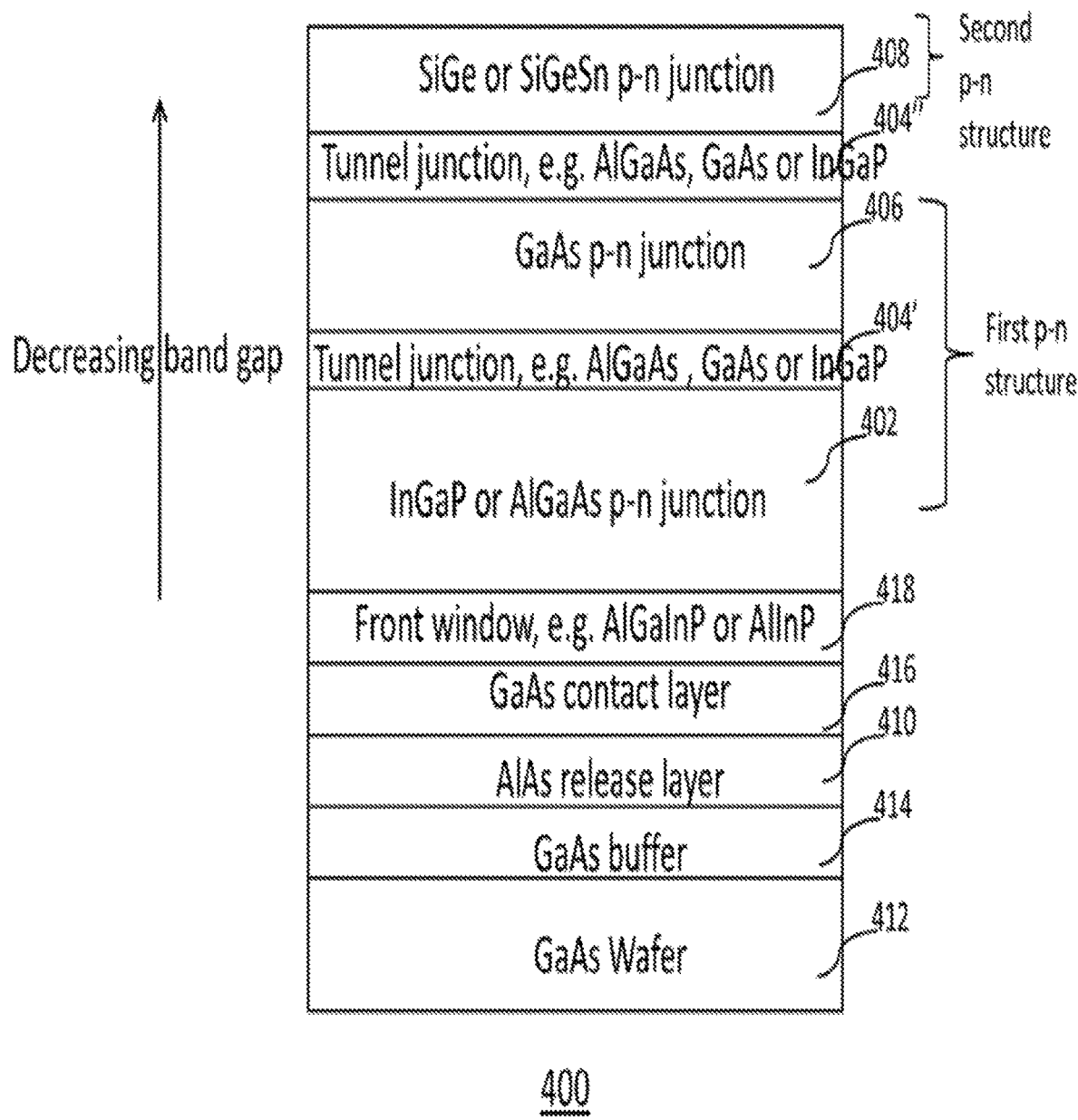
FIG. 4 illustrates an example of an epitaxially-grown triple junction optoelectronic device with SiGe or SiGeSn as a bottom junction using GaAs as a substrate before the device is separated from the substrate, in accordance with various aspects of the disclosure.

FIG. 4 illustrates an example of an embodiment or implementation of an epitaxially grown triple junction optoelectronic device 400 with SiGe or SiGeSn as a bottom junction and using GaAs as a substrate before the device is separated from the substrate according to the present disclosure. In an embodiment or implementation, the triple junction optoelectronic device 400 is epitaxially grown on a GaAs wafer 412. A GaAs buffer layer 414 is deposited on the GaAs wafer 412 followed by AlAs release layer 410. A GaAs contact layer 416 is then deposited on the AlAs release layer 410 followed by a front window layer 418, for example, AlGaInP or AlInP. A tunnel junction 404', comprising, for example, AlGaAs, GaAs, or InGaP, is grown on a first p-n junction 402 of a first p-n structure that follows the front window layer 418, where the first p-n junction 402 includes an AlInGaP, InGaP, or AlGaAs absorber layer. The tunnel junction 404' may also be grown using a material or materials different from AlGaAs, GaAs, or InGaP. The first p-n structure also includes a second p-n junction 406, such as GaAs absorber layer, over the first p-n structure and over the tunnel junction 404' if present. A second p-n structure includes a first p-n junction 408, which may be referred to as the third p-n junction of the triple junction optoelectronic device 400, where the first p-n junction 408 includes a SiGe or SiGeSn absorber layer. The first p-n junction 408 of the second p-n structure may be coupled to the second p-n junction 406 of the first p-n structure via a tunnel junction 404", if present. The first and second p-n junctions of the first p-n structure (e.g., p-n junctions 402 and 406) and the third p-n junction that is part of the second p-n structure (e.g., p-n junction 408) are grown sunny side down with decreasing band gap from the first p-n junction to the second p-n junction and from the second p-n junction to the third p-n junction, and are coupled by tunnel junctions 404' and 404". A support layer (not shown) can be deposited on the second p-n structure either before or after the device is separated from the substrate.

Figure 5:
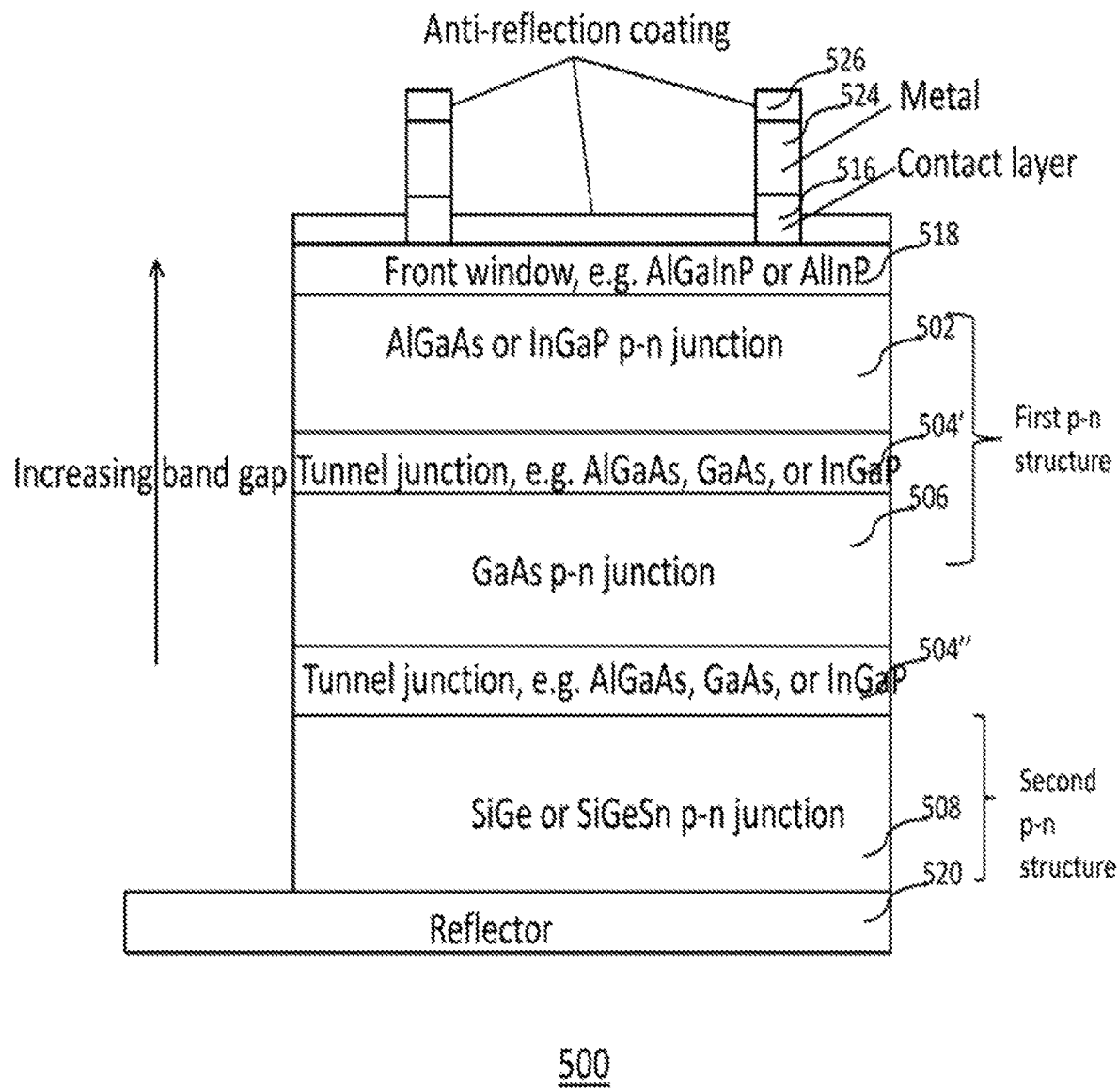
FIG. 5 illustrates another example of an epitaxially-grown triple junction optoelectronic device with SiGe or SiGeSn as a bottom junction and front metal contacts after the device is separated from the substrate, in accordance with various aspects of the disclosure.

FIG. 5 illustrates an example of an embodiment or implementation of a triple-junction optoelectronic device 500 with SiGe or SiGeSn as a bottom junction and using GaAs as a substrate and front metal contacts after the device is separated from the substrate according to an embodiment of the disclosure. The triple junction optoelectronic device 500 as shown in FIG. 5 comprises an anti-reflection coating (ARC) 526, front metal contacts 524, a contact layer 516, a front window layer 518, for example, AlGaInP or AlInP. The triple junction optoelectronic device 500 also includes a first p-n structure and a second p-n structure. The first p-n structure includes a first p-n junction 502, for example, AlGaAs or InGaP, a second p-n junction 506, for example, GaAs. The second p-n structure includes a third p-n junction 508, for example, SiGe or SiGeSn, where the third p-n junction 508 is the bottom cell away from the incident light, followed by a reflector layer or a reflective back contact 520. The third p-n junction 508 may also be referred to as the first p-n junction of the second p-n structure. The first p-n junction 502, the second p-n junction 506, and the third p-n junction 508 can be electrically coupled by using tunnel junctions 504' and 504" as shown in FIG. 5, wherein the first p-n junction 502, the second p-n junction 506, and the third p-n junction 508 are voltage generating junctions of the triple-junction optoelectronic device 500, and the tunnel junctions 504' and 504" provide electrical coupling between the first, second and third p-n junctions and/or the rest of the device.

In an embodiment or implementation of the triple-junction optoelectronic device 500, the bottom junction (e.g., the third p-n junction 508 of the second p-n structure) can comprise a Group IV semiconductor including at least one of SiGe, SiGeSn, SiSn, or GeSn. Similarly, the first p-n junction (e.g., the first p-n junction 502 of the first p-n structure) can comprise a Group III-V semiconductor including at least one of AlInGaP, InGaP or AlGaAs. In addition, the second p-n junction 506 of the first p-n structure can comprise a Group III-V semiconductor. Moreover, there may be a third p-n junction of the first p-n structure (not shown). Examples of a third p-n junction of a first p-n structure are described in more detailed below with respect to FIG. 7C.

Although the embodiments or implementations illustrated in the examples of FIGS. 4 and 5 describe a triple junction optoelectronic device (e.g., devices 400 and 500), one of ordinary skill in the art readily recognizes that one or more additional p-n structures and/or additional p-n junctions could be added to the devices 400 and 500 in a similar fashion, either above or below existing p-n structures and/or p-n junctions, and possibly coupled to the rest of the device through a tunnel junction layer or layers. One of ordinary skill in the art also recognizes that a variety of materials listed could differ from the examples listed herein. Furthermore, each of the p-n junctions formed in the devices 400 and 500 could be a homojunction or a heterojunction, that is, both the N-layer and P-layer could be made of the same material, or the N-layer and the P-layer could be made of different materials, in accordance with the present disclosure. Also the doping of the materials in a p-n structure or p-n junction could be inverted. For example, the p-type material could be placed at the top of the structure or junction, facing the sun, and n-type material could be placed at the bottom of the structure or junction.

Figure 6:
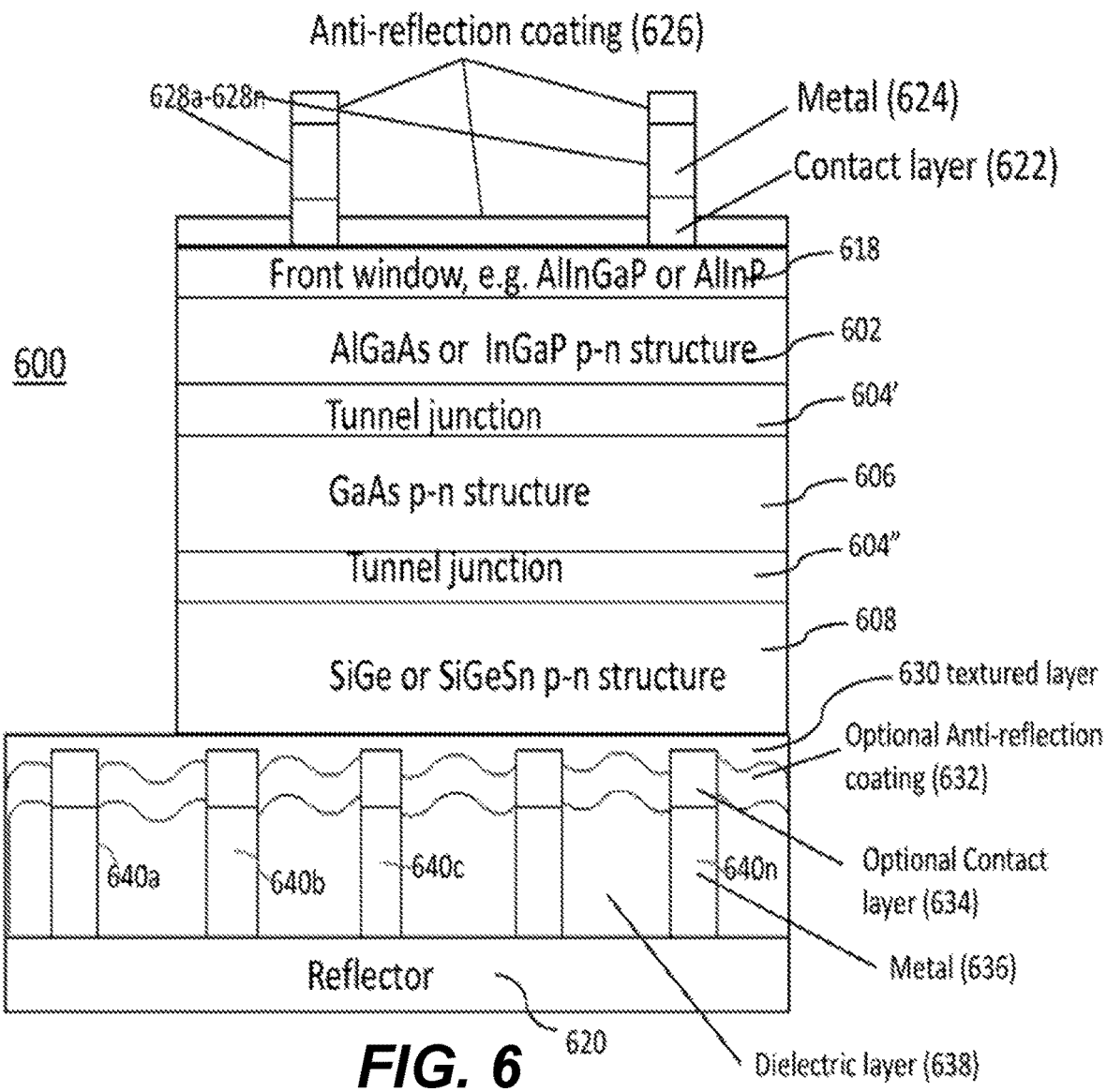
FIG. 6 illustrates another example of a multi-junction optoelectronic device, in accordance with various aspects of the disclosure.

FIG. 6 illustrates another example of an embodiment or implementation of a multi-junction optoelectronic device 600 according to the present disclosure. The multi-junction optoelectronic device 600 includes semiconductor structures 602, 606 and 608. The semiconductor structure 602 corresponds to a first p-n junction, the semiconductor structure 606 corresponds to a second p-n junction, and the semiconductor structure 608 corresponds to a third p-n junction, where semiconductor structures 602 and 606 can be part of a first p-n structure and semiconductor structure 608 can be part of a second p-n structure. In an embodiment or implementation, the semiconductor structures 602, 606 and 608 comprise an n-layer and p-layer coupled together (e.g., to form at least one p-n junction as part of each structure). However, one of ordinary skill in the art readily would recognize that a variety of materials, including but not limited to, GaAs, AlGaAs, InGaP, InGaAs, AlInGaP, InGaAsP, and alloys thereof, etc., could be utilized for either of these layers and that would be in accordance with the present disclosure. Furthermore, the junction (e.g., p-n junction) formed between the two layers (e.g., the n-layer and the p-layer) need not be a heterojunction, that is, the junction could be a homojunction where both the n-layer and p-layer are made of the same material (both layers being GaAs or both layers AlGaAs, for example) and that would be in accordance with present disclosure. Also the doping of the materials in a p-n structure or p-n junction could be inverted. For example, the p-type material could be placed at the top of the structure or junction, facing the sun, and the n-type material could be placed at the bottom of the structure or junction. Furthermore, the multi-junction optoelectronic device 600 could be comprised of multiple p-n layers grown in series, for example.

In this embodiment or implementation, on a top side of the semiconductor structure 602 are a plurality of contact members 628a-628n. Each of the top-side contact members 628a-628n comprise an optional antireflective coating (ARC) 626, a n-metal contact 624 underneath the optional ARC 626, and a gallium arsenide (GaAs) contact 622 underneath the n-metal contact 624. On a back side of the semiconductor structure 608 is a plurality of non-continuous contacts 640a-640n. Each of the non-continuous contacts 640a-640n includes an optional contact layer 634 coupled to the back side of the semiconductor structure 608, and a p-metal contact 636 underneath the contact layer 634. An optional ARC layer 632 can also be present on the back side of the multi-junction optoelectronic device 600 as illustrated in FIG. 6. There can also be a textured layer 630, between the ARC 632 and the semiconductor structure 608.

Similar to FIG. 5, the contact layers can contain Group III-V semiconductor materials, such as gallium arsenide (GaAs), depending on the desired composition of the final optoelectronic device. According to embodiments or implementations described herein, the contact layers can be heavily n-doped. In some embodiments or implementations, the doping concentration of the contact layers can be within a range greater than about $5 \times 10^{18}$ cm$^{-3}$, for example, from greater than about $5 \times 10^{18}$ cm$^{-3}$ to about $1 \times 10^{19}$ cm$^{-3}$. The high doping of the contact layers of the multi-junction optoelectronic device 600 allows an ohmic contact to be formed with a later-deposited metal layer without the need to perform annealing to form such an ohmic contact.

The multi-junction optoelectronic device 600 includes three structures (e.g., three p-n structures), as described above. One of the structures has a higher band gap and is placed or positioned on the top of the multi-junction optoelectronic device 600, and another of the structures has a lower band gap and is placed or positioned on the bottom of the multi-junction optoelectronic device 600.

The structure 602, which can be referred to as the p-n structure 602, has higher or larger bandgap than the structure 608 and is comprised of a window layer 618 (for example, AlInP, AlGaInP, or AlGaAs), an n-type material (for example, AlInGaP, InGaP or AlGaAs), and a p-type material (for example, AlInGaP, InGaP or AlGaAs). The structure 602 can optionally include a back side window layer (for example, AlInP, AlGaInP, or AlGaAs). The structure 602 is electrically and optically connected to structure 606, which may be referred to as p-n structure 606, through a tunnel junction structure 604'. The tunnel junction structure 604' is comprised of a highly p-type doped layer and a highly n-type doped layer, for example, GaAs, InGaP, or AlGaAs.

The structure 608, which can be referred to as the p-n structure 608, has lower or smaller bandgap than the structure 602 and comprises an n-type material (for example, SiGe), a p-type material (for example, SiGe). The structure 608 can optionally include a back side window layer, for example, AlInP, AlGaInP, or AlGaAs. In some embodiments or implementations, the back side window layer could correspond to the textured layer 630. The structure 608 is electrically and optically connected to structure 606 through a tunnel junction structure 604". The tunnel junction structure 604" is comprised of a highly p-type doped layer and a highly n-type doped layer, for example, GaAs, InGaP or AlGaAs.

One of ordinary skill in the art readily recognizes that a variety of materials listed could differ from the examples listed herein. Furthermore, the p-n junctions formed in structures 602 and/or 608 could be homojunctions or heterojunctions, that is, both the n-layer and p-layer could be made of the same material (e.g., homojunction), or could be made of different materials (e.g., heterojunction), and that would be in accordance with the present disclosure. Also the doping of the materials in a p-n structure or p-n junction could be inverted. For example, the p-type material could be placed at the top of the structure or junction, facing the sun, and the n-type material could be placed at the bottom of the structure or junction. One or more additional p-n structures could be added to the multi-junction optoelectronic device 600 as illustrated by the structure 606, which may be referred to as the p-n structure 606. The structure 606 could be possibly coupled to the rest of the device through a tunnel junction layer or layers.

Figure 7A:
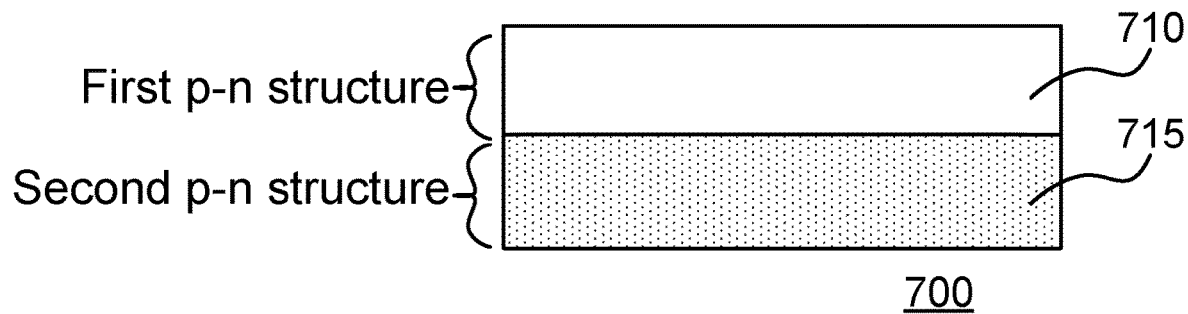
FIG. 7A illustrates an example of a multi-junction optoelectronic device with a single p-n junction in a first p-n structure, in accordance with various aspects of the disclosure.
Figure 7B:
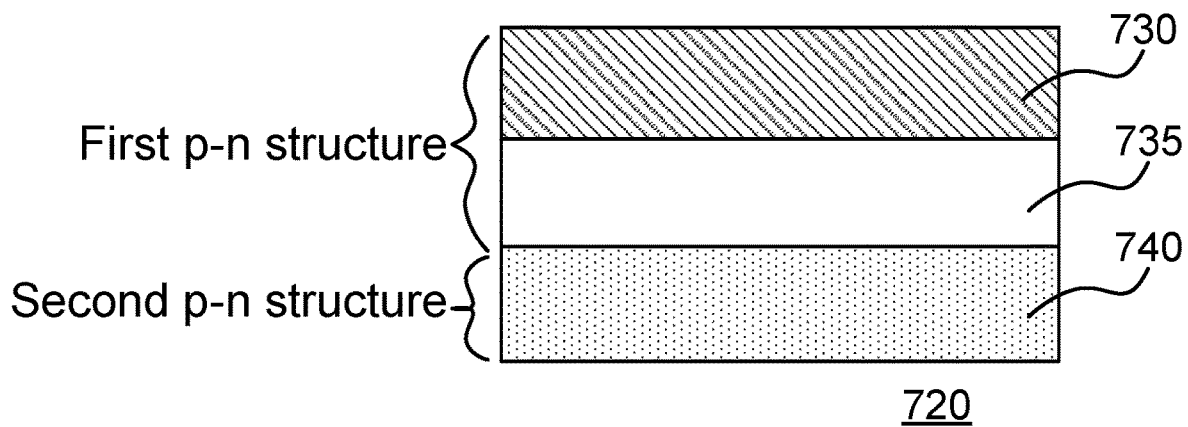
FIG. 7B illustrates an example of a multi-junction optoelectronic device with two p-n junctions in a first p-n structure, in accordance with various aspects of the disclosure.
Figure 7C:
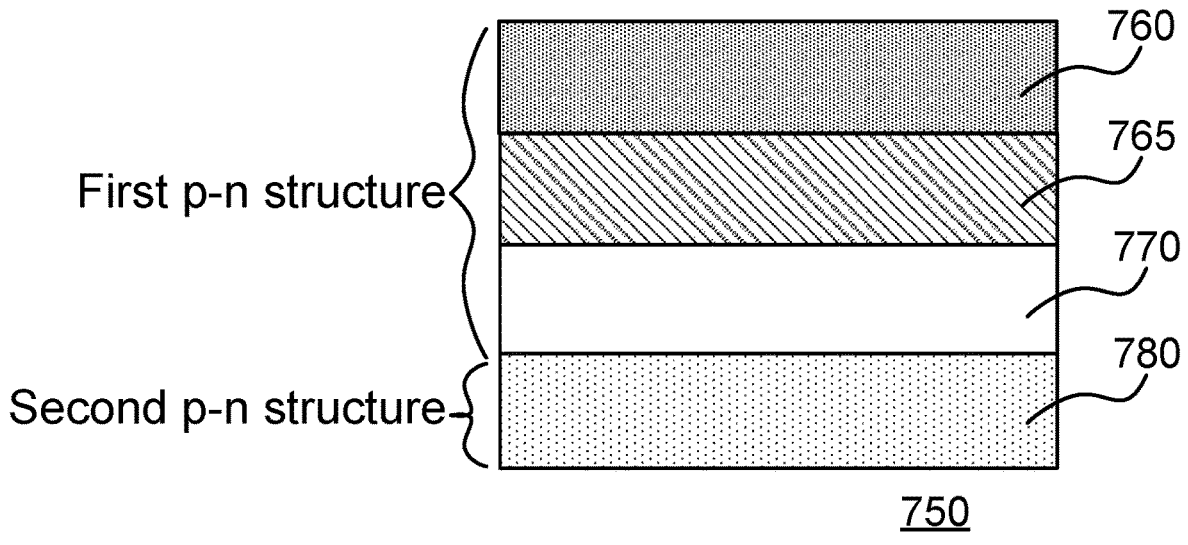
FIG. 7C illustrates an example of a multi-junction optoelectronic device with three p-n junctions in a first p-n structure, in accordance with various aspects of the disclosure.

In connection with one or more of FIGS. 1-6 described above, various embodiments or implementations of multi-junction optoelectronic devices can be formed based on the various structures illustrated in FIGS. 7A-7C. In one example, as shown in FIG. 7A, a multi-junction optoelectronic device 700 can include a first p-n junction 710 made of Group III-V semiconductor materials and a second p-junction 715 made of Group IV semiconductor materials. In one aspect, the first p-n junction 710 can be a GaAs p-n junction and the second p-n junction 715 can be a SiGe p-n junction such that the multi-junction optoelectronic device 700 has GaAs on SiGe. In another aspect, the first p-n junction 710 can be a GaAs p-n junction and the second p-n junction 715 can be a SiGeSn p-n junction such that the multi-junction optoelectronic device 700 has GaAs on SiGeSn. Moreover, the first p-n junction 710 can be part of a first p-n structure and the second p-n junction 715 can be part of a second p-n structure.

In another example, as shown in FIG. 7B, a multi-junction optoelectronic device 720 can include a first p-n junction 730 and a second p-n junction 735 made of Group III-V semiconductor materials and a third p-junction 740 made of Group IV semiconductor materials. In one aspect, the first p-n junction 730 can be an InGaP p-n junction, the second p-n junction 735 can be a GaAs p-n junction, and the third p-n junction 740 can be a SiGe p-n junction such that the multi-junction optoelectronic device 720 has InGaP/GaAs on SiGe. In another aspect, the first p-n junction 730 can be an AlGaAs p-n junction, the second p-n junction 735 can be a GaAs p-n junction, and the third p-n junction 740 can be a SiGe p-n junction such that the multi-junction optoelectronic device 720 has AlGaAs/GaAs on SiGe. In yet another aspect, the first p-n junction 730 can be an InGaP p-n junction, the second p-n junction 735 can be a GaAs p-n junction, and the third p-n junction 740 can be a SiGeSn p-n junction such that the multi-junction optoelectronic device 720 has InGaP/GaAs on SiGeSn. In yet another aspect, the first p-n junction 730 can be an AlGaAs p-n junction, the second p-n junction 735 can be a GaAs p-n junction, and the third p-n junction 740 can be a SiGeSn p-n junction such that the multi-junction optoelectronic device 720 has AlGaAs/GaAs on SiGeSn. Moreover, the first p-n junction 730 and the second p-n junction 735 can be part of a first p-n structure and the third p-n junction 740 can be part of a second p-n structure.

In another example, as shown in FIG. 7C, a multi-junction optoelectronic device 750 can include a first p-n junction 760, a second p-n junction 765, and a third p-n junction 770 made of Group III-V semiconductor materials and a fourth p-junction 780 made of Group IV semiconductor materials. In one aspect, the first p-n junction 760 can be an AlInGaP p-n junction, the second p-n junction 765 can be an InGaAsP p-n junction, the third p-n junction 770 can be a GaAs p-n junction, and the fourth p-n junction 780 can be a SiGe p-n junction such that the multi-junction optoelectronic device 750 has AlInGaP/InGaAsP/GaAs on SiGe. In another aspect, the first p-n junction 760 can be an AlInGaP p-n junction, the second p-n junction can be an AlGaAs p-n junction, the third p-n junction 770 can be a GaAs p-n junction, and the fourth p-n junction 780 can be a SiGe p-n junction such that the multi-junction optoelectronic device 750 has AlInGaP/AlGaAs/GaAs on SiGe. In yet another aspect, the first p-n junction 760 can be an AlInGaP p-n junction, the second p-n junction 765 can be an InGaAsP p-n junction, the third p-n junction 770 can be a GaAs p-n junction, and the fourth p-n junction 780 can be a SiGeSn p-n junction such that the multi-junction optoelectronic device 750 has AlInGaP/InGaAsP/GaAs on SiGeSn. In yet another aspect, the first p-n junction 760 can be an AlInGaP p-n junction, the second p-n junction 765 can be an AlGaAs p-n junction, the third p-n junction 770 can be a GaAs p-n junction, and the fourth p-n junction 780 can be a SiGeSn p-n junctions such that the multi-junction optoelectronic device 750 has AlInGaP/AlGaAs/GaAs on SiGeSn. Moreover, the first p-n junction 760, the second p-n junction 765, and the third p-n junction 770 can be part of a first p-n structure and the fourth p-n junction 780 can be part of a second p-n structure.

While the foregoing is directed to example embodiments or implementation of various aspects of the disclosure, other and further embodiments or implementation of various aspects of the disclosure can be devised without departing from the basic scope thereof, and the scope thereof is determined by the claims that follow. Accordingly, the figures are intended to be illustrative rather than definitive or limiting. In particular many design elements could change, including but not limited to: the optoelectronic device could include junctions that are p-on-n rather than n-on-p, a structure in the optoelectronic device could include two or more junctions, the optoelectronic device could include a junction that is a homojunction, the tunnel junctions could be made of AlGaAs, GaAs or InGaP or other material, other layers within the optoelectronic device, or within a structure of the optoelectronic device, could be exchanged with different materials, e.g., AlGaAs or AlGaInP instead of AlInP, etc., and the reflector of the optoelectronic device could be made purely of a metal or metal alloy, as well as a dielectric and a metal or metal alloy.

Although the present disclosure has been described in accordance with the embodiments or implementations shown, one of ordinary skill in the art will readily recognize that there could be variations to the embodiments or implementations, and those variations would be in accordance with the present disclosure. Accordingly, many modifications can be made by one of ordinary skill in the art without departing from the scope of the appended claims.

What is claimed is:

1. A method for fabricating a multi junction optoelectronic device, the method comprising:
    forming a multi junction structure on a substrate comprising:
        providing a first p-n structure on the substrate using a first chemical vapor deposition process, wherein the first p-n structure comprises a first base layer of a first semiconductor with a first bandgap such that a lattice constant of the first semiconductor matches a lattice constant of the substrate, and wherein the first semiconductor comprises a Group III-V semiconductor;
        providing a second p-n structure on the first p-n structure using a second chemical vapor deposition process, wherein the second p-n structure comprises a second base layer of a second semiconductor with a second bandgap, wherein a lattice constant of the second semiconductor matches the lattice constant of the first semiconductor, and wherein the second semiconductor comprises a Group IV semiconductor, wherein the second bandgap is less than the first bandgap;
        depositing a support layer on the second p-n structure, the support layer comprising a back side window layer on the second p-n structure to form a textured surface, and a dielectric layer on the textured surface of the back side window layer, wherein the support layer is composed of one or more materials having a chemical resistance to acids; and
    lifting the multi junction structure off the substrate, wherein the multi junction structure is configured such that the first p-n structure is closer than the second p-n structure to a side of the multi junction structure on which light is to be incident after the multi junction structure is lifted off the substrate.

2. The method of claim 1, wherein the multi junction optoelectronic device is a flexible device.

3. The method of claim 1, wherein the substrate comprises a GaAs wafer.

4. The method of claim 1, wherein there is a first tunnel junction between the first p-n structure and the second p-n structure.

5. The method of claim 1, wherein the first semiconductor comprises one or more of GaAs, AlGaAs, InGaP, InGaAs, AlInGaP, AlInGaAs, InGaAsP, AlInGaAsP, GaN, InGaN, AlGaN, AlInGaN, GaP, alloys thereof, or derivatives thereof.

6. The method of claim 1, wherein the second semiconductor comprises one or more of Si, Ge, C, Sn, alloys thereof, or derivatives thereof.

7. The method of claim 1, wherein the second semiconductor has a smaller energy gap than the first semiconductor.

8. The method of claim 1, wherein one or both of the first p-n structure or the second p-n structure comprise a physically textured surface.

9. The method of claim 8, wherein the physically textured surface is achieved by a lattice mismatch between at least two materials in the first p-n structure or the second p-n structure by using any of a Stranski-Krastanov process or a Volmer-Weber process.

10. The method of claim 1, wherein the first p-n structure further comprises one or more p-n junctions.

11. The method of claim 1, wherein the second p-n structure further comprises one or more p-n junctions.

12. The method of claim 1, wherein the support layer further comprises one or more of a semiconductor contact layer, a passivation layer, a transparent conductive oxide layer, an anti-reflective coating, a metal coating, an adhesive layer, an epoxy layer, or a plastic coating.

13. The method of claim 1, wherein at least one of the first p-n structure or the second p-n structure comprises a heterojunction.

14. The method of claim 1 further comprises providing a sacrificial layer on the substrate suitable for an epitaxial liftoff process.

15. The method of claim 14, wherein the sacrificial layer comprises AlAs.

16. The method of claim 1, further comprising applying an epitaxial lift off (ELO) process for lifting the multi junction structure off the substrate.

17. The method of claim 1, wherein the first chemical vapor deposition process and the second chemical vapor deposition process are a same type of process.

* * * * *